(12) United States Patent
Dimaano, Jr. et al.

(10) Patent No.: US 10,714,431 B2
(45) Date of Patent: Jul. 14, 2020

(54) SEMICONDUCTOR PACKAGES WITH ELECTROMAGNETIC INTERFERENCE SHIELDING

(71) Applicant: UTAC Headquarters Pte. Ltd., Singapore (SG)

(72) Inventors: Antonio Bambalan Dimaano, Jr., Singapore (SG); Dzafir Bin Mohd Shariff, Singapore (SG); Seung Guen Park, Singapore (SG); Roel Adeva Robles, Singapore (SG)

(73) Assignee: UTAC Headquarters Pte. Ltd., Singapore (SG)

( * ) Notice: Subject to any disclaimer, the term of this patent is extended or adjusted under 35 U.S.C. 154(b) by 10 days.

(21) Appl. No.: 16/057,773

(22) Filed: Aug. 7, 2018

(65) Prior Publication Data

US 2019/0051614 A1 Feb. 14, 2019

Related U.S. Application Data

(60) Provisional application No. 62/542,322, filed on Aug. 8, 2017.

(51) Int. Cl.
*H01L 23/552* (2006.01)
*H01L 23/50* (2006.01)
(Continued)

(52) U.S. Cl.
CPC .......... *H01L 23/552* (2013.01); *H01L 21/561* (2013.01); *H01L 21/568* (2013.01); *H01L 23/3128* (2013.01); *H01L 23/50* (2013.01); *H01L 24/02* (2013.01); *H01L 24/13* (2013.01); *H01L 24/20* (2013.01); *H01L 2224/02311* (2013.01); *H01L 2224/02319* (2013.01); *H01L 2224/02379* (2013.01); *H01L 2224/02381* (2013.01); *H01L 2224/13024* (2013.01);
(Continued)

(58) Field of Classification Search
CPC ..... H01L 23/552; H01L 21/561; H01L 24/02; H01L 24/13; H01L 21/568; H01L 23/50; H01L 2224/13024; H01L 2224/02319
USPC ......... 438/106, 121, 126, 127; 257/659, 687
See application file for complete search history.

(56) References Cited

U.S. PATENT DOCUMENTS 8,362,598 B2 1/2013 Park et al.
9,236,356 B2 1/2016 Yang et al.
(Continued)

*Primary Examiner* — Thinh T Nguyen
(74) *Attorney, Agent, or Firm* — Horizon IP Pte Ltd

(57) ABSTRACT

Semiconductor packages having an electromagnetic interference (EMI) shielding layer and methods for forming the same are disclosed. The method includes providing a base carrier defined with an active region and a non-active region. A fan-out redistribution structure is formed over the base carrier. A die having elongated die contacts are provided. The die contacts corresponding to conductive pillars. The die contacts are in electrical communication with the fan-out redistribution structure. An encapsulant having a first major surface and a second major surface opposite to the first major surface is formed. The encapsulant surrounds the die contacts and sidewalls of the die. An electromagnetic interference (EMI) shielding layer is formed to line the first major surface and sides of the encapsulant. An etch process is performed after forming the EMI shielding layer to completely remove the base carrier and singulate the semiconductor package.

20 Claims, 32 Drawing Sheets

(51) Int. Cl.
*H01L 21/56* (2006.01)
*H01L 23/00* (2006.01)
*H01L 23/31* (2006.01)

(52) U.S. Cl.
CPC .... *H01L 2224/18* (2013.01); *H01L 2924/181* (2013.01); *H01L 2924/3025* (2013.01); *H01L 2924/3511* (2013.01)

(56) References Cited

U.S. PATENT DOCUMENTS

| | | |
|---|---|---|
| 9,583,446 B2 | 2/2017 | Pagaila et al. |
| 2003/0146509 A1* | 8/2003 | Zhao et al. ............. H01L 24/97 257/38 |
| 2012/0286407 A1* | 11/2012 | Choi et al. .......... H01L 21/4853 257/670 |
| 2017/0135219 A1* | 5/2017 | Hsu et al. .............. H05K 1/111 |
| 2017/0141046 A1 | 5/2017 | Jeong et al. |
| 2018/0277489 A1* | 9/2018 | Han et al. ............. H01L 21/552 |
| 2018/0374717 A1* | 12/2018 | Hsu et al. ............. H01L 21/561 |

* cited by examiner

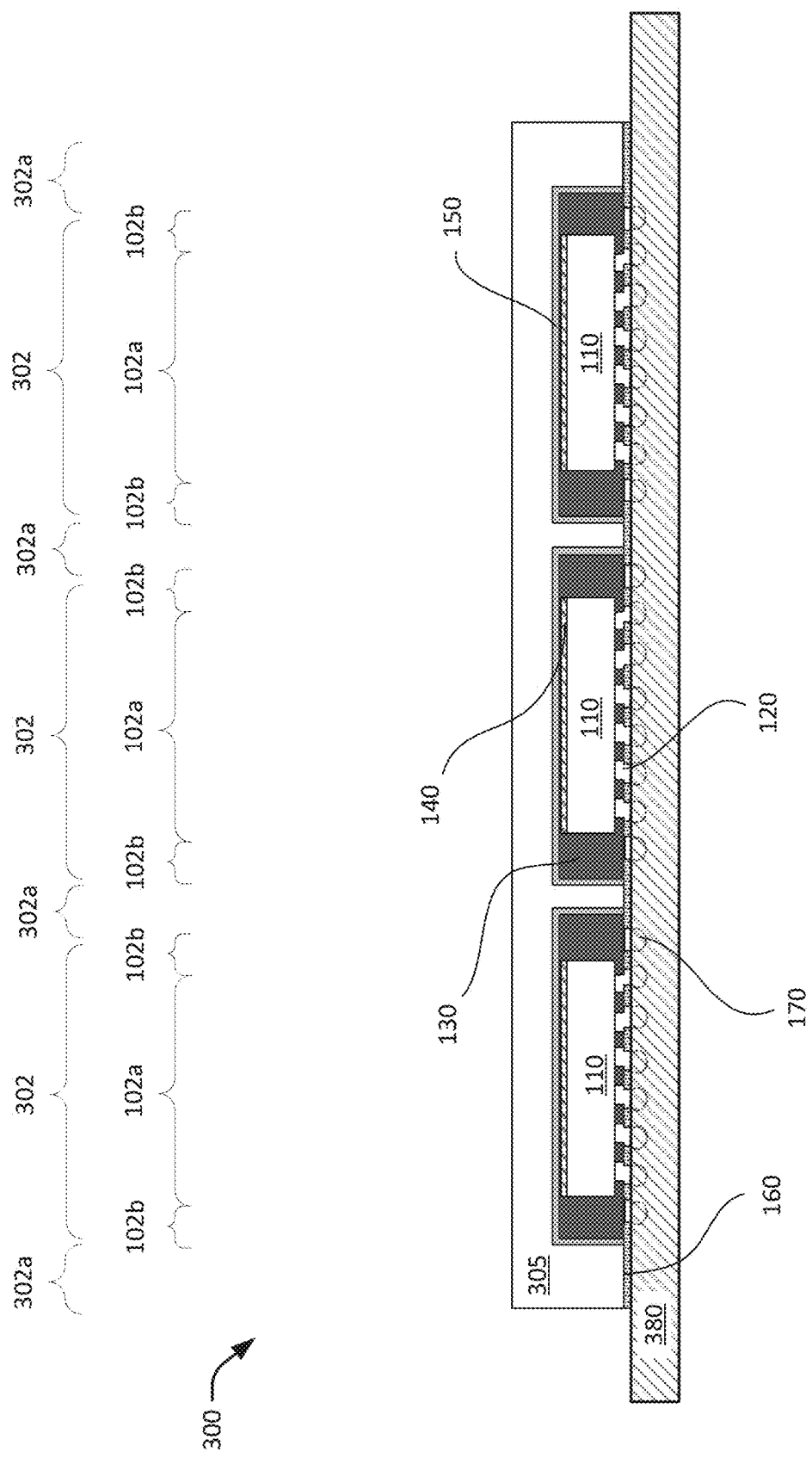

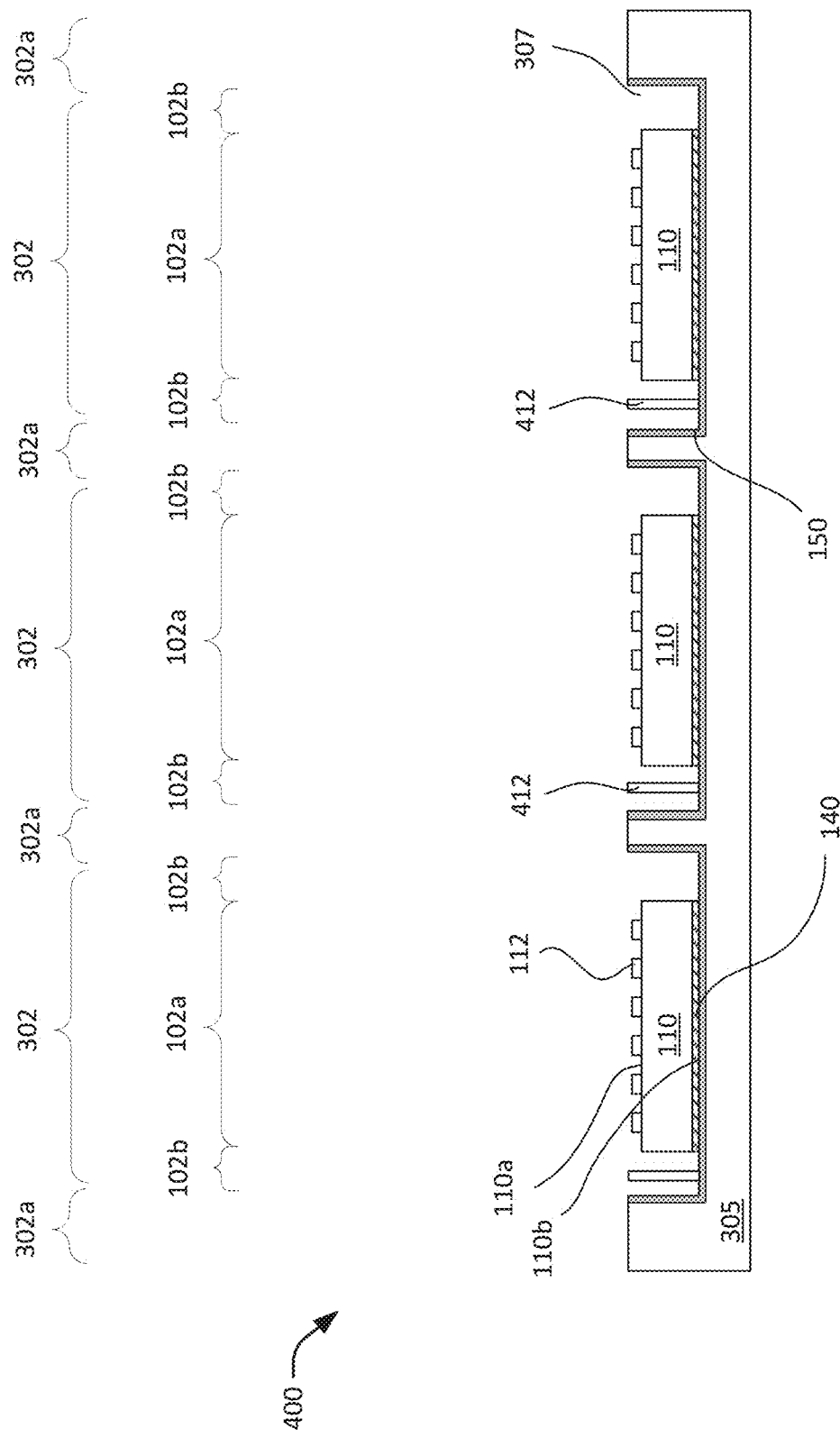

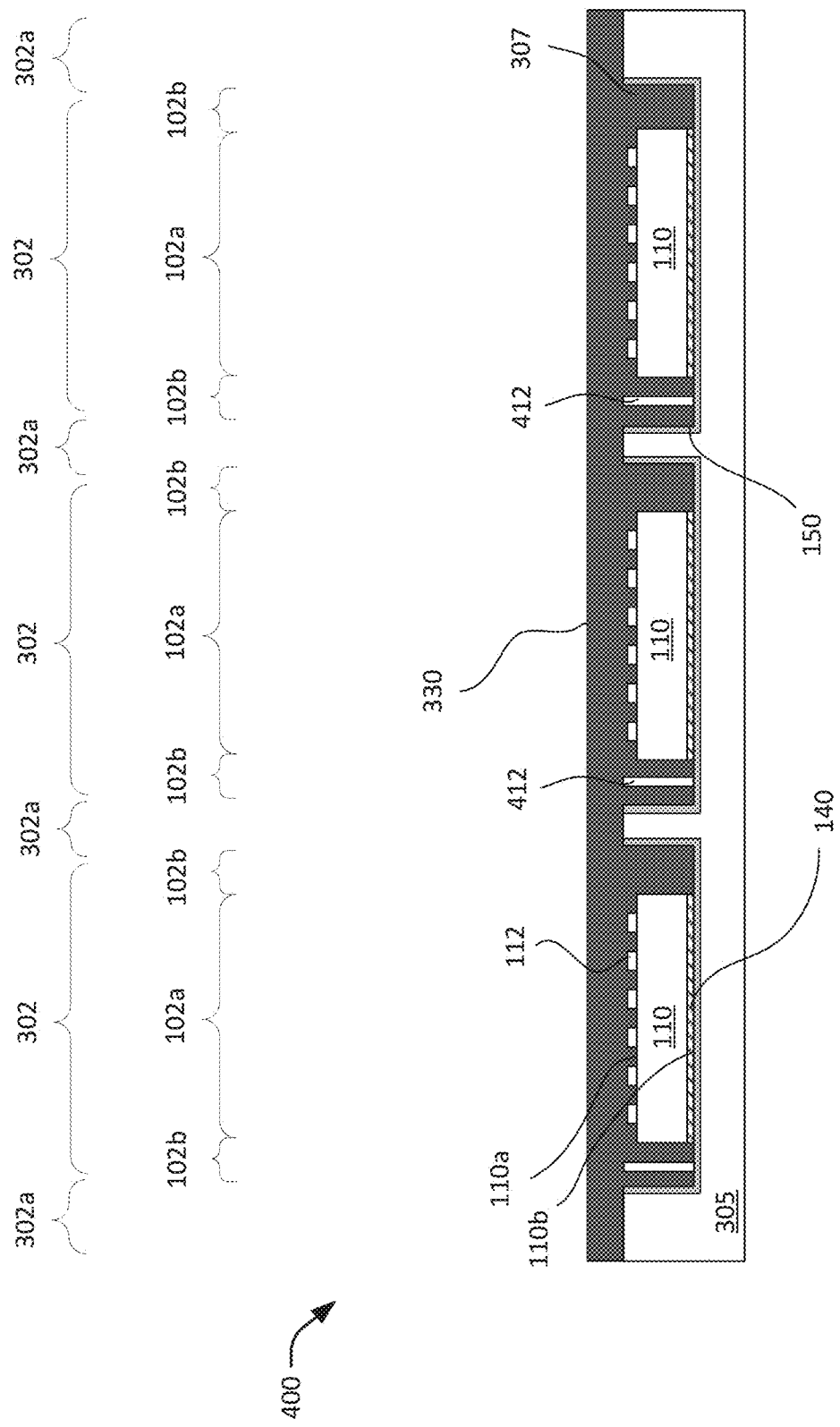

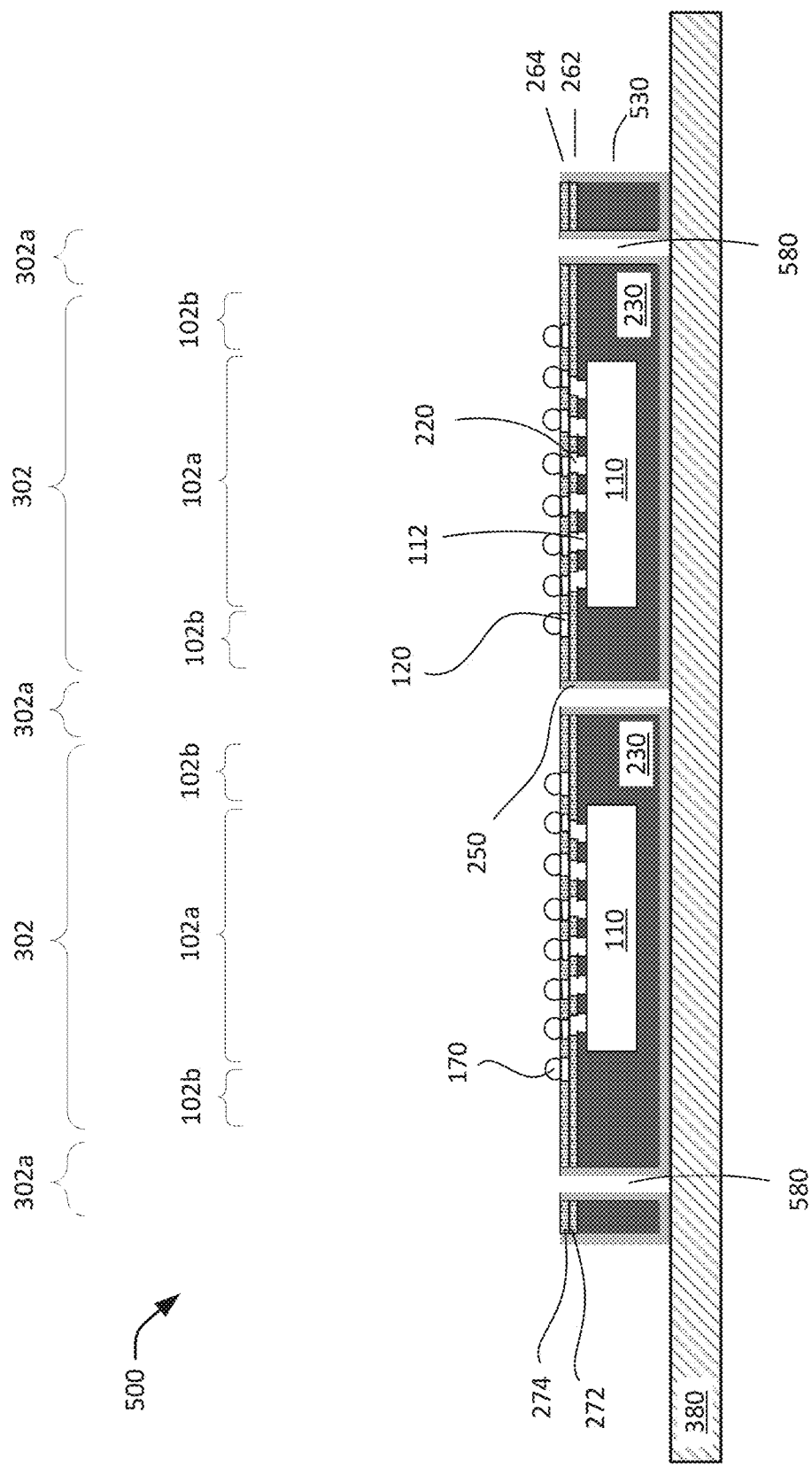

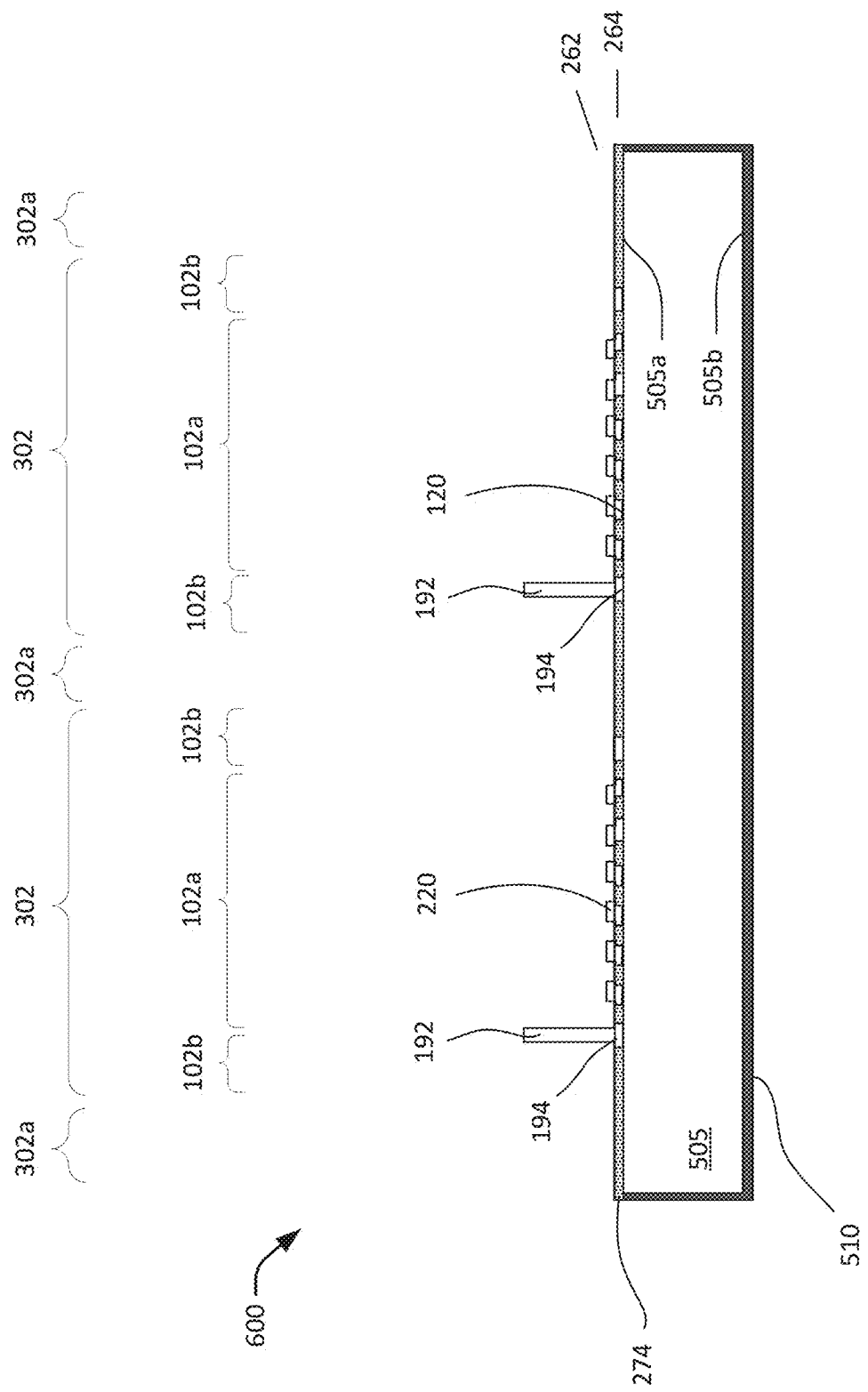

SEMICONDUCTOR PACKAGES WITH ELECTROMAGNETIC INTERFERENCE SHIELDING

CROSS-REFERENCE TO RELATED APPLICATION

This application claims the benefit of U.S. Provisional Application Ser. No. 62/542,322, filed on Aug. 8, 2017, which is herein incorporated by reference in its entirety for all purposes.

TECHNICAL FIELD

The present disclosure relates generally to semiconductor packaging technology. More particularly, the disclosure relates to a semiconductor package with an electromagnetic interference (EMI) shielding module.

BACKGROUND

Given the advancement and proliferation of wireless devices such as laptops and smart phones, semiconductor packages are increasingly exposed to external sources of electromagnetic radiation, which negatively affects the reliability of one or more semiconductor chips within the semiconductor packages. As new generations of wireless devices move toward miniaturization and increased functionality, there is a growing need to provide effective EMI shielding solutions at the semiconductor package level that is able to complement high-density semiconductor packaging technologies. For example, by providing a solution for shielding semiconductor chips from electromagnetic interference, electromagnetic interference (EMI)-sensitive components can be placed in proximity of components that emit disruptive electromagnetic energy.

From the foregoing discussion, there is a need to provide an improved semiconductor packaging solution for shielding semiconductor chips from electromagnetic interference, and a cost-effective method for manufacturing the same.

SUMMARY

Embodiments relate generally to semiconductor packages and methods for forming semiconductor packages. In one embodiment, a method for forming a semiconductor package is disclosed. The method includes providing a base carrier defined with an active region and a non-active region. A fan-out redistribution structure is formed over the base carrier. A die having first and second major surfaces is provided. The first major surface is an active surface of the die and the second major surface is an inactive surface of the die. The die includes elongated die contacts protruding from the active surface of the die. The die contacts corresponding to conductive pillars. The die contacts are in electrical communication with the fan-out redistribution structure. An encapsulant having a first major surface and a second major surface opposite to the first major surface is formed. The first major surface is proximate to the inactive surface of the die. The encapsulant surrounds the die contacts and sidewalls of the die. An electromagnetic interference (EMI) shielding layer is formed. The EMI shielding layer lines the first major surface and sides of the encapsulant. An etch process is performed after forming the EMI shielding layer to completely remove the base carrier and singulate the semiconductor package.

In another embodiment, the method includes providing a base carrier defined with an active region and a non-active region. A fan-out redistribution structure is formed over the base carrier. The fan-out redistribution structure comprises first and second type contact pads. The first type contact pads are disposed in a first passivation layer and the second type contact pads are disposed in a second passivation layer positioned over the first passivation layer. A die having first and second major surfaces is provided. The first major surface is an active surface of the die and the second major surface is an inactive surface of the die. The die comprises elongated die contacts protruding from the active surface of the die. The die contacts corresponding to conductive pillars. The die contacts are directly connected to the first type contact pads. An encapsulant is formed to surround the die contacts and sidewalls of the die. The encapsulant includes a first major surface and a second major surface opposite to the first major surface. The first major surface of the encapsulant is proximate to the inactive surface of the die. An electromagnetic interference (EMI) shielding layer is formed to line the first major surface and sides of the encapsulant.

In yet another embodiment, a semiconductor package is disclosed. The semiconductor package includes a die having first and second major surfaces. The die comprises elongated die contacts protruding from its first major surface. The die contacts corresponding to conductive pillars. The semiconductor package includes an encapsulant having top and bottom surfaces. The top surface of the encapsulant is substantially coplanar to a top of the die contacts. The encapsulation surrounds the die contacts and covers sides of the die. The semiconductor package includes a fan-out redistribution structure in electrical communication with the die contacts, and an electromagnetic interference (EMI) shielding layer covering sidewalls of the encapsulant.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following:

FIGS. 1b-1d show simplified cross-sectional views of various embodiments of a semiconductor package similar to that shown in FIG. 1a;

FIGS. 2b-2c show simplified cross-sectional views of various embodiments of a semiconductor package similar to that shown in FIG. 2a;

FIGS. 3a-3i show cross-sectional views of an embodiment of a process for forming a semiconductor package;

FIGS. 4a-4b show cross-sectional views of another embodiment of a process for forming a semiconductor package;

FIGS. 5a-5i show cross-sectional views of yet another embodiment of a process for forming a semiconductor package;

FIGS. 6a-6b show cross-sectional views of another embodiment of a process for forming a semiconductor package.

DETAILED DESCRIPTION

Embodiments generally relate to semiconductor packages and methods for forming a semiconductor package. More particularly, the embodiments disclose a semiconductor package with electromagnetic interference (EMI) protection and methods of forming a semiconductor package with EMI protection. The package includes one or more semiconductor dies or chips. For the case of packages having more than one die, the dies may be arranged in a planar arrangement. Providing dies in a vertical arrangement may also be useful. The dies, for example, may include memory devices, logic devices such as mixed signal logic devices, communication devices, RF devices, optoelectronic devices, digital signal processors (DSPs), microcontrollers, system-on-chips (SOCs) as well as other types of devices or a combination thereof. In some embodiments, one or more circuit components may also be incorporated with one or more dies in the semiconductor package. Such packages may be incorporated into electronic products or equipment, such as phones, computers as well as mobile and mobile smart products. Incorporating the packages into other types of products such as automotive applications may also be useful.

Figure 1A:
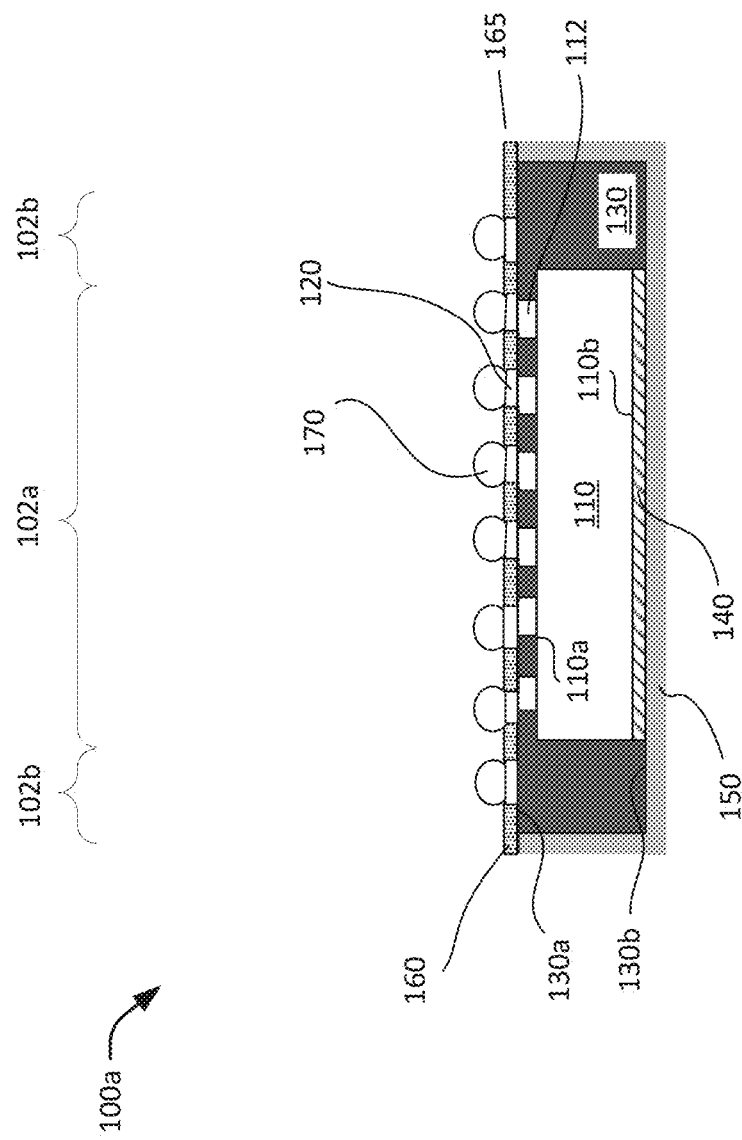
FIG. 1a shows a simplified cross-sectional view of an embodiment of a semiconductor package.
Figure 1B:
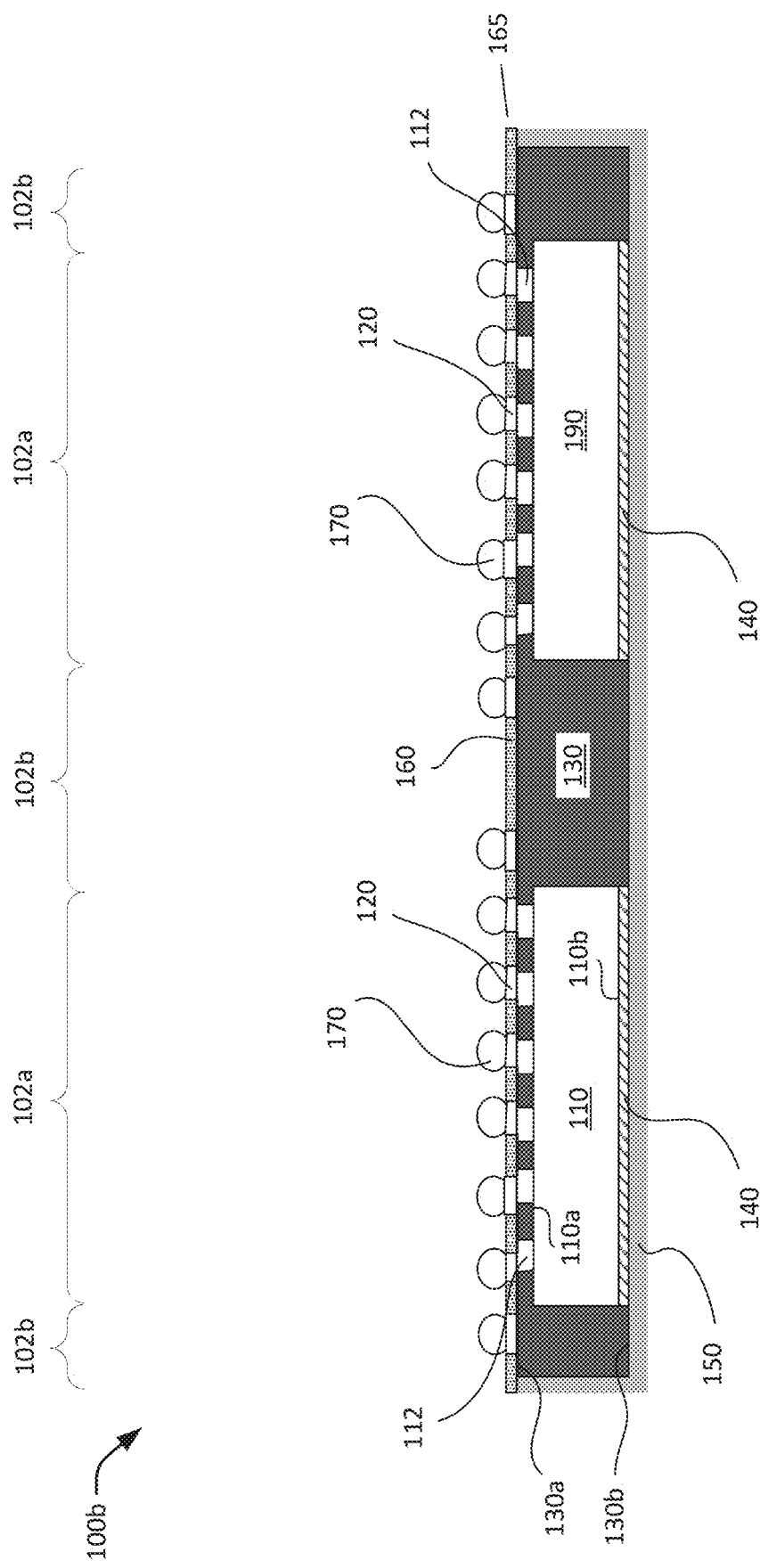
Figure 1C:
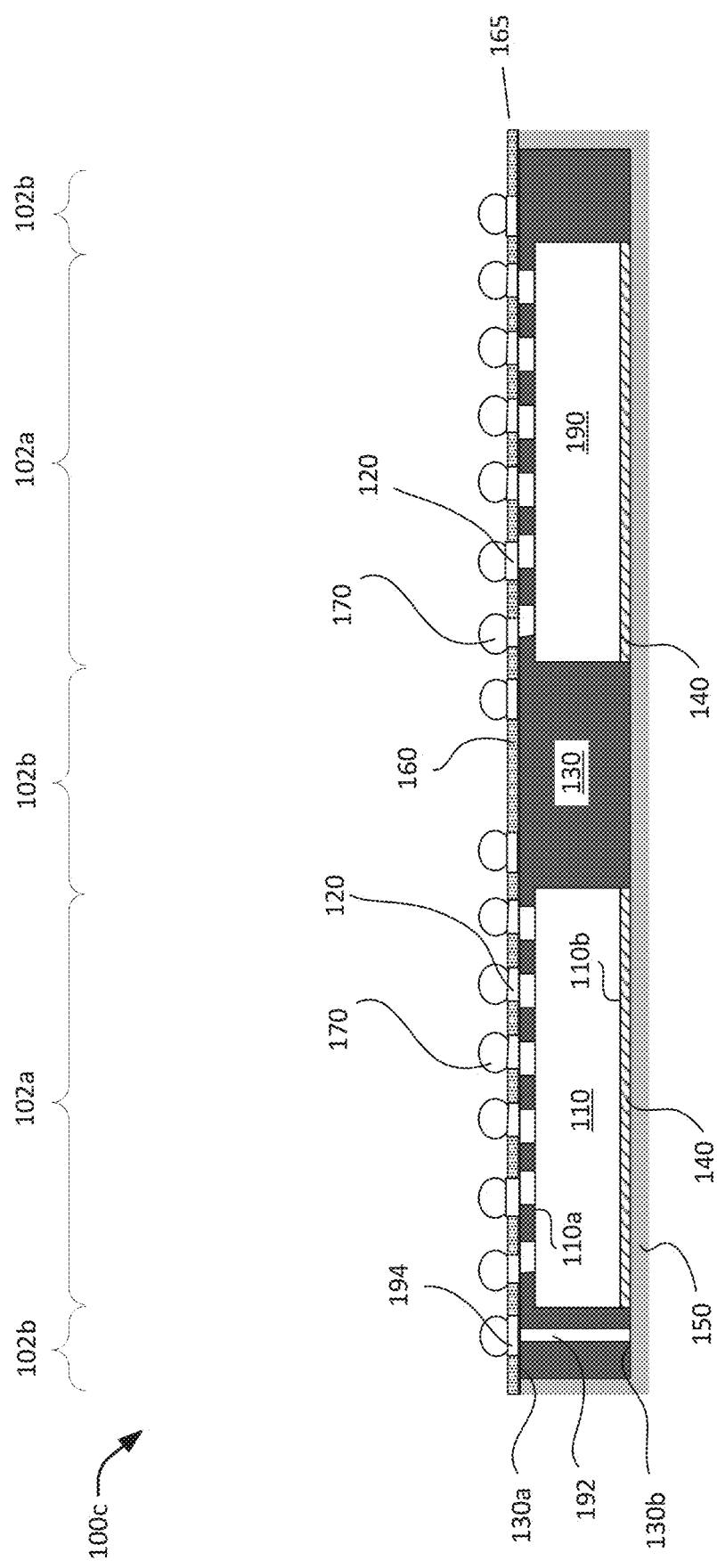
Figure 1D:
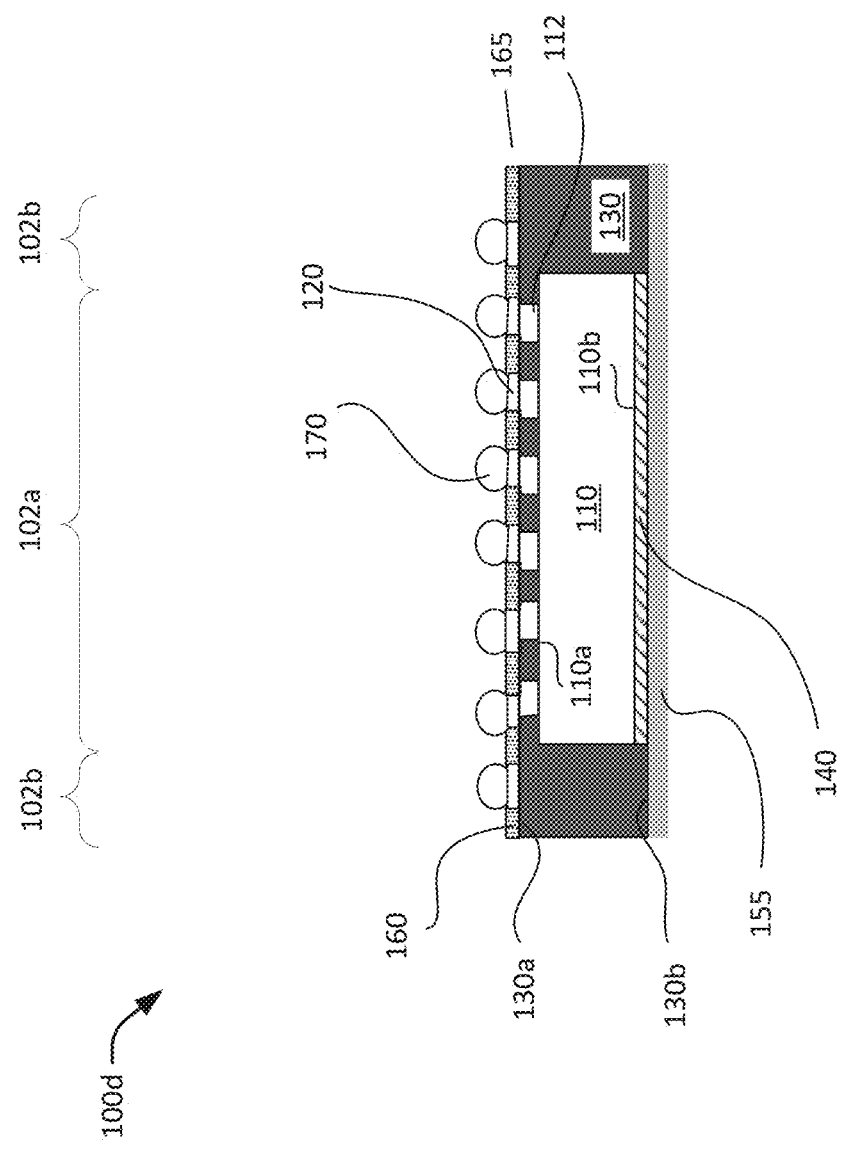

FIGS. 1a-1d show simplified cross-sectional views of various embodiments of a semiconductor package. Specifically, FIG. 1a shows an embodiment of a semiconductor package 100a and FIGS. 1b-1d show various embodiments of a semiconductor package similar to that shown in FIG. 1a. The semiconductor package 100a, as shown in FIG. 1, is defined with die and non-die regions 102a and 102b. The non-die region 102b, for example, surrounds the die region 102a. The die region 102a, in one embodiment, includes a semiconductor die (or chip) 110 attached to a shielding layer 150, as will be described in more detail. The die 100 is, for example, centrally disposed in the die region 102a of the shielding layer 150. Other configurations of die and non-die regions may also be useful.

The die 110 includes first and second major surfaces 110a and 110b. For example, the first major surface 110a is an active surface of the die while the second major surface 110b is an inactive surface of the die. Other designations for the surfaces of the die may also be useful. The active surface, for example, includes openings (not shown) in a final passivation layer to expose conductive die pads (not shown). The die pads provide electrical connections to the internal circuitry of the die 110.

In one embodiment, the die 110 includes die contacts 112 disposed on the die pads to electrically connect the die pads of the die 110 to a redistribution layer (or level) of the package 100a in a flip-chip manner. For example, the die 110 is a flip-chip assembly. The die contacts may be metal bumps. In one embodiment, the die contacts 112 are elongated metal bumps. For example, the die contacts 112 are defined by conductive posts (or pillars) extending from the die pads. Providing other configurations of die contacts 112 may also be useful. The die pads and die contacts 112 may be formed from any suitable conductive material such as, but not limited to copper (Cu), aluminum (Al), gold (Au), nickel (Ni) or any alloy thereof. For example, the die pads and die contacts are formed of the same conductive material. Other types of conductive material may also be used for the die pads and die contacts. Providing die contacts and die pads formed from different conductive materials may also be useful.

The semiconductor package 100a includes an encapsulant 130 surrounding the die 110. The encapsulant 130 includes first and second major surfaces 130a-130b. The first major surface 130a, for example, may be the top planar encapsulant surface and the second major surface 130b may be the bottom planar encapsulant surface. Other designations for the top and bottom surfaces of the encapsulant 130 may also be useful. In one embodiment, the encapsulant 130 covers the active surface 110a and sides of the die 110. For example, the encapsulant surrounds the die contacts 112 and covers portions of the active surface 110a exposed by the die contacts 112. The top surface 130a of the encapsulant may be substantially coplanar with a top surface the die contacts 112. In one embodiment, the encapsulant 130 includes a molding material. The encapsulant, for example, includes epoxy resin. Other suitable types of material for encapsulating the die may also be useful.

The die contacts 112 are electrically connected to a redistribution layer (RDL) 165 defined by interconnect structures of the semiconductor package 100a. The redistribution layer 165 includes horizontal and vertical interconnect structures corresponding to conductive traces (not shown) and via contacts (not shown) respectively. Conductive traces provide a horizontal electrical connection through the redistribution layer while via contacts provide a vertical electrical connection through the redistribution layer. In one embodiment, the interconnect structures of the redistribution layer 165 includes first type contact pads and second type contact pads. The first type contact pads (not shown) may serve as contact interfaces for electrically connecting the redistribution layer 165 to the die contacts 112. For example, the die contacts 112 are directly connected to first type contact pads positioned in the die region 102a and configured to match the pattern of the die pads 112.

In one embodiment, the redistribution layer 165 of the semiconductor package 100a includes second type contact pads 120, which serve as contact interfaces for package contacts 170. For example, the second type contact pads 120 serve as input/output (I/O) terminals of the semiconductor package 100a. The second type contact pads 120 may be positioned in the die and non-die regions 102a and 102b of the semiconductor package 100a to provide a fan-out redistribution structure for routing electrical signals. For example, conductive traces and via contacts electrically connect the first type contact pads to the second type contact pads 120 to form the interconnect pattern of the semiconductor package 100a. The conductive traces, via contacts, and the first and second type contact pads may be formed of a same conductive material such as, but not limited to, aluminum (Al), copper (Cu) or an alloy thereof. Providing conductive traces, via contacts, and first and second type contact pads having different conductive materials may also be useful.

A passivation layer 160 is disposed on the top surface 130a of the encapsulant 130. The passivation layer 160, for example, traverses the die and non-die regions 102a and 102b of the semiconductor package 100a. The passivation layer 160 includes a sufficient thickness to surround the interconnect structures of the redistribution layer 165 and insulate each of the conductive traces, via contacts, and first and second type contact pads to prevent shorting. In one embodiment, the passivation layer includes dielectric material. For example, the passivation layer may be formed from a solder resist layer or inorganic insulating material including silicon oxide (SiO2) and aluminum oxide (Al2O3). Other suitable types of dielectric material may also be used. In one embodiment, the passivation layer 160 is configured with a top surface that is coplanar with the top surface of the second type contact pads 120. For example, the passivation layer 160 covers the sides of the second type contact pads 120. Other configurations of the passivation layer 160 may also be useful. For example, the passivation layer 160 may also be configured with a top surface that is higher than the top surface of the second type contact pads 120.

In one embodiment, package contacts 170 are disposed on the top surface of the second type contact pads 120 exposed by the passivation layer 160. The package contacts 170 provide external access to the die 110 via the redistribution layer 165. The package contacts 170 may be metal bumps. The package contacts, for example, are spherical shaped bumps. Other shapes or configurations of package contacts may also be useful. Various types of conductive material can be used to form the package contacts 170. The package contacts 170, for example, can be formed from solder materials including lead-based or non lead-based solder. Other suitable types of conductive materials may also be used. The package contacts 170 are, for example, electrically connected to an external device, such as a printed circuit board (not shown).

A shielding layer 150 is provided around the semiconductor package 100a. In one embodiment, the shielding layer wraps around the entire bottom surface 130b and sides of the encapsulant 130. For example, the shielding layer 150 includes vertical portions covering vertical side surfaces of the encapsulant 130 and a horizontal portion covering the bottom surface 130b of the encapsulant 130. In one embodiment, the shielding layer 150 covers and contacts a portion of the bottom surface of the passivation layer 165 (e.g., portion extending beyond the sides of the encapsulant 130). The top surface 130a of the encapsulant 130 is, for example, not covered by the shielding layer 150. The shielding layer 150 may be formed from a metal material which provides high shielding effectiveness against electromagnetic interference (EMI). In one embodiment, the shielding layer includes nickel (Ni) alloy. For example, the shielding layer is formed from nickel-gold-palladium (NiAuPd) alloy. Other suitable metal materials may also be employed to form the shielding layer. In an alternative embodiment, the shielding layer may be formed from other metal materials. For example, the shielding layer may be a silver (Ag) or silver alloy layer. The shielding layer 150 serves to protect the semiconductor package 100a from electromagnetic interference (EMI) as well as radiofrequency interference (RFI).

In one embodiment, a die attach layer 140 is disposed on the shielding layer 150. For example, the bottom surface 130b of the encapsulant 130 is substantially coplanar with a bottom of the die attach layer 140. The die attach layer 140 is, for example, an adhesive layer. Various adhesive material may be used to form the die attach layer 140, including epoxy resin paste, polyimide tape, or the like. The die attach layer 140 attaches the die 110 to the shielding layer 150. For example, the bottom surface 110b of the die 110 is directly mounted onto the die attach layer 140.

In comparison with conventional semiconductor packages, the present invention provides a fan-out wafer level packaging solution having EMI shielding layer (shielding layer 150). The EMI shielding layer extends over vertical side surfaces and a second major surface of the encapsulant 130 to provide the fan-out semiconductor package 100a with an effective EMI shielding solution. The EMI shielding layer advantageously provides radiofrequency interference (RFI) shielding. Moreover, having an EMI shielding layer formed from NiAuPd alloy also provides the semiconductor package 100a with protection against corrosion. The present invention also enables the semiconductor package 100a to be reliably deployed in System-on-Chip (SoC) technology without being adversely affected by undesirable electromagnetic radiation from other packages or components.

FIG. 1b shows an alternative embodiment of the semiconductor package described in FIG. 1a. The semiconductor package 100b shown in FIG. 1b is similar to that described in FIG. 1a. Common elements and features having the same reference numerals may not be described or described in detail. In the interest of brevity, the description of the semiconductor package shown in FIG. 1b below primarily focuses on the difference(s) compared with the package shown in FIG. 1a.

Referring to FIG. 1b, the semiconductor package 100b includes multiple die regions 102a to accommodate a plurality of semiconductor dies. In one embodiment, the semiconductor package 100b includes at least a first and a second semiconductor die 110 and 190 positioned side by side in the encapsulant 130 to provide a dual-chip package having EMI shielding. The first and second semiconductor dies are, for example, encapsulated by a common encapsulant 130. As shown, a shielding layer 150 wraps around the entire bottom surface 130b and sides of the encapsulant 130. The first and second semiconductor dies may be same or different type of semiconductor dies. A die attach layer 140 attaches each of the first and second semiconductor die to the corresponding die regions 120a of the shielding layer 150. The first semiconductor die 110 may be separated from the second semiconductor die 190 by one or more non-die regions 120b of the shielding layer 150. For example, the first and second semiconductor dies may be separated by a shared (or common) non-die region to reduce footprint of the semiconductor package 100b. Although a dual-chip package is illustrated, it is understood that the encapsulant 130 and shielding layer 150 may also be configured to accommodate additional semiconductor dies to provide a multi-chip package having EMI shielding.

The semiconductor package 100b described with respect to FIG. 1b may be reliably deployed in System-in-Package (SiP) technology and Package-in-Package technology without being adversely affected by undesirable electromagnetic radiation from other packages or components. For example, the shielding layer 150 may provide highly effective EMI and RFI shielding around a package system having multiple semiconductor dies.

FIG. 1c shows an alternative embodiment of the semiconductor package described in FIG. 1a. The semiconductor package 100c shown in FIG. 1c is similar to that described in FIG. 1a-1b. Common elements and features having the same reference numerals may not be described or described in detail. In the interest of brevity, the description of the semiconductor package shown in FIG. 1c below primarily focuses on the difference(s) compared with the package shown in FIG. 1b.

Referring to FIG. 1c, the semiconductor package 100c includes a first semiconductor die 110 juxtaposed to a second semiconductor die 190 in the encapsulant 130. A die attach layer 140 attaches each of the first and second semiconductor dies to the shielding layer 150. In one embodiment, the semiconductor package 100c includes one or more ground connectors 192. The ground connector 192 may be positioned in the peripheral regions of the semiconductor package 100c. For example, a ground connector 192 is disposed in the non-die region 102b adjacent to a side of the encapsulant 130. The ground connector 192 extends vertically from the first major surface 130a to the second major surface 130b of the encapsulant 130 to electrically connect the shielding layer 150 to a ground pad 194 positioned in the peripheral region of the semiconductor package 100c. The ground pad 194 may correspond to a second type contact pad positioned in the non-die region 102b of the passivation layer 160. For example, a second type contact pad having a ground connection may be designated as the ground pad 194. The ground connector 192 may be formed from any suitable conductive material such as Cu, Al, Ni, Au, their alloys, and solder materials. A path to ground from the ground pad 194 to an external ground connection (not shown) may be provided by a package contact 170 disposed on the top surface of the ground pad 194.

The semiconductor package 100c described with respect to FIG. 1c includes same or similar advantages associated with the shielding layer 150 as described with respect to FIGS. 1a-1b. Moreover, by electrically connecting the shielding layer 150 to the ground pad 194, a close loop ground configuration may be achieved. For example, the shielding layer 150 and ground pad may be electrically connected to a common external ground connection.

FIG. 1d shows an alternative embodiment of the semiconductor package described in FIG. 1a. The semiconductor package 100d shown in FIG. 1d is similar to that described in FIGS. 1a-1c. Common elements and features having the same reference numerals may not be described or described in detail. In the interest of brevity, the description of the semiconductor package shown in FIG. 1d below primarily focuses on the difference(s) compared with the package shown in FIG. 1a.

Referring to FIG. 1d, the semiconductor package 100d includes a shielding layer 155 disposed on the second major surface 130b of the encapsulant. In one embodiment, the shielding layer 155 covers the entire bottom surface 130b of the encapsulant without extending to cover the sides of the encapsulant 130. For example, the sides of the encapsulant 130 are exposed. In one embodiment, a carrier structure employed during a process for forming the semiconductor package 100d is etched to a desired thickness to form the shielding layer 155. The carrier structure may be a copper (Cu) carrier structure. For example, the shielding layer 155 is a Cu layer having a thickness of about 10 µm. Other thickness dimensions may also be useful.

The semiconductor package 100d as described with respect to FIG. 1d provides a fan-out wafer level packaging solution having a copper shielding layer (e.g., shielding layer 155). The shielding layer 155 covers the entire second major surface 130b of the encapsulant 130 to provide the fan-out semiconductor package 100d with an effective EMI and RFI shielding solution. Moreover, by utilizing copper material to form the shielding layer 155, the semiconductor package 100d provides a cost-effective EMI shielding solution.

Although a redistribution layer 165 and a passivation layer 160 is illustrated in FIGS. 1a-1d, it will be appreciated by one of ordinary skill in the art that the semiconductor packages 100a-100d may also be configured with more than one redistribution layer and/or passivation layer without departing from the scope of the present invention.

Figure 2A:
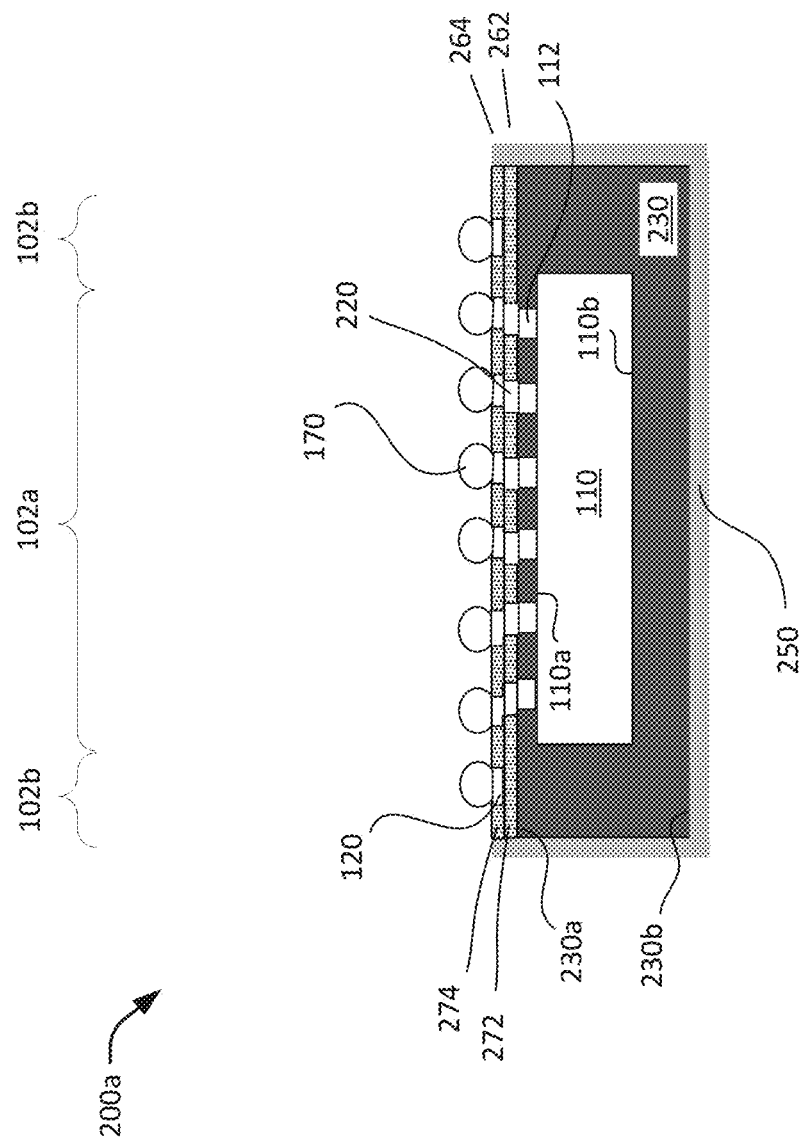
FIG. 2a shows a simplified cross-sectional view of another embodiment of a semiconductor package.
Figure 2B:
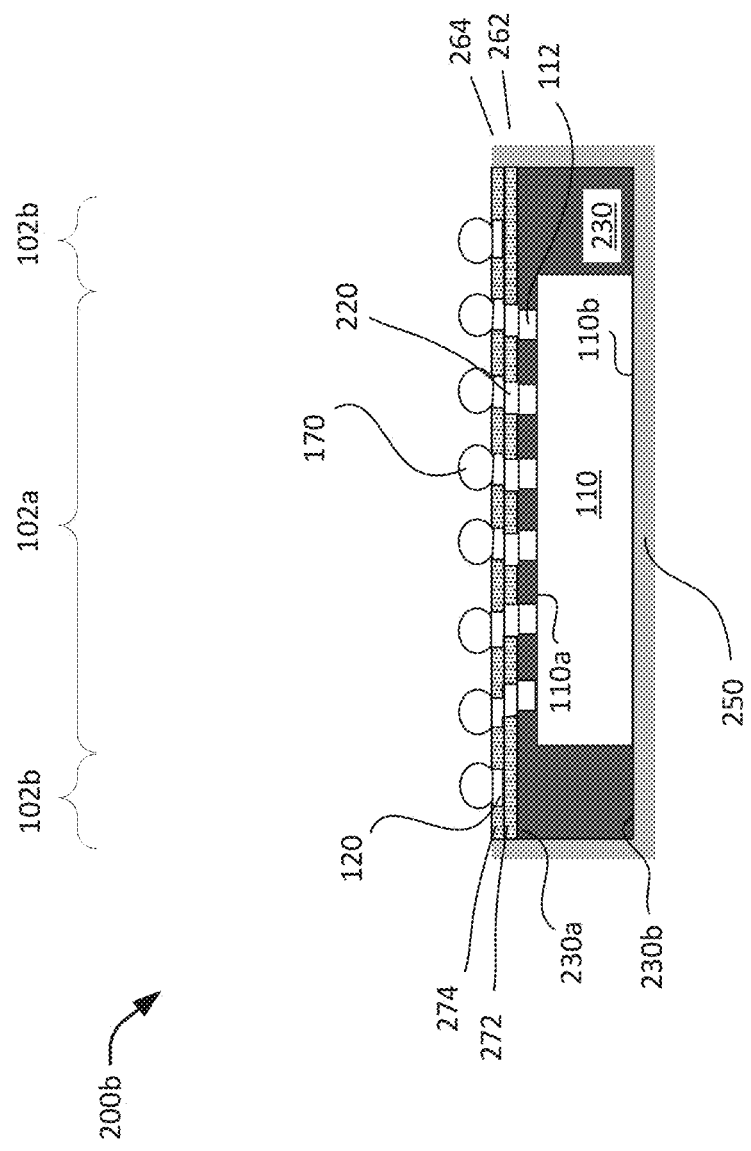
Figure 2C:
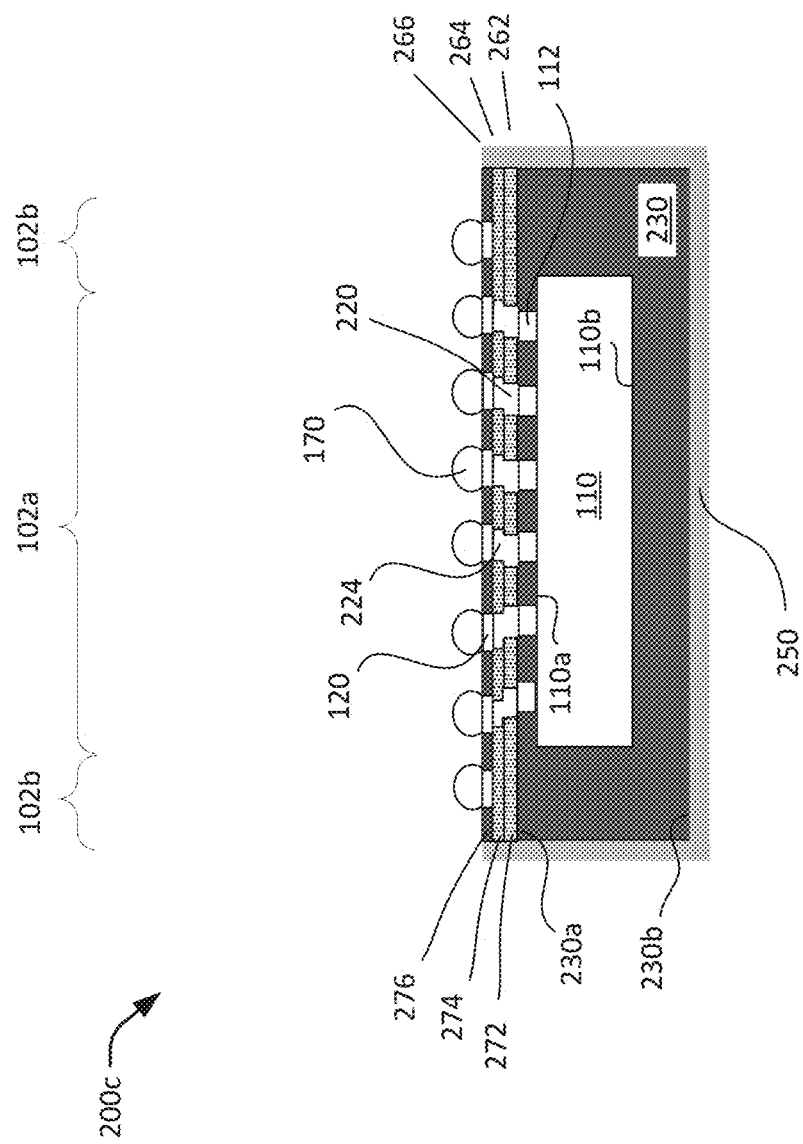

FIGS. 2a-2c show simplified cross-sectional views of various embodiments of a semiconductor package. Specifically, FIG. 2a shows an embodiment of a semiconductor package 200a similar that that described in FIG. 1a, and FIGS. 2b-2c show various embodiments of a semiconductor package similar to that shown in FIG. 2a. Common elements and features having the same reference numerals may not be described or described in detail. In the interest of brevity, the description of the package shown in FIG. 2a below primarily focuses on the difference(s) compared with the package shown in FIG. 1a.

Referring to FIG. 2a, the semiconductor package 200a includes an encapsulant 230 surrounding the semiconductor die 110. The encapsulant 230 includes first and second major surfaces 230a and 230b. The first major surface 230a, for example, may be the top surface and the second major surface 230b may be the bottom surface. Other designations for the surfaces of the encapsulant 230 may also be useful. In one embodiment, the encapsulant 230 wraps around and covers the first and second major surfaces of the die 110 and sides of the die. For example, the encapsulant 230 surrounds the die contacts 112 and covers portions of the active surface 110a of the die 110 exposed by the die contacts 112. The top surface 230a of the encapsulant 230 may be substantially coplanar with a top surface the die contacts 112. The encapsulant 230, for example, includes molding material such as, but not limited to, epoxy resin. Other suitable types of material for encapsulating the die 110 may also be useful.

The semiconductor package 200a includes more than one redistribution layer (RDL). The redistribution layers extend across the die and non-die regions 102a and 102b of the semiconductor package 200a. In one embodiment, the semiconductor package 200a includes a first and a second redistribution layer 262 and 264. For example, the first redistribution layer 262 includes conductive traces (not shown), via contacts (not shown) and first type contact pads 220 disposed in a first passivation layer 272, while the second redistribution layer 264 includes conductive traces (not shown), via contacts (not shown) and second type contact pads 120 disposed in a second passivation layer 274. Via contacts, for example, provide an interconnection between the first and second redistribution layers. The via contacts, conductive traces, and first and second type contact pads form interconnect structures of the semiconductor package 200a. In one embodiment, the interconnect structures of the semiconductor package 200a may be formed of the same conductive material. For example, the interconnect structures may be formed of Al, Cu or any alloy thereof. Providing interconnect structures formed of different conductive materials may also be useful.

In one embodiment, the first type contact pads 220 in the first passivation layer 272 provide a contact interface for the die contacts 112 while the second type contact pads 120 in the second passivation layer 274 serve as input/output (I/O) terminals of the semiconductor package 200a. For example, package contacts 170 are directly connected to the second type contact pads 120 to electrically connect the die 110 to an external device (not shown), such as a printed circuit board (PCB).

The second passivation layer 274 is disposed on the top surface of the first passivation layer 272 and surrounds the second type contact pads 120. The second passivation layer 274, for example, includes a sufficient thickness to isolate each of the interconnect elements of the second redistribution layer 264 from other interconnect elements of the second redistribution layer 264. The first passivation layer 272 is disposed on the top surface 230a of the encapsulant 230 and surrounds the first type contact pads 220. The first passivation layer 272, for example, includes a sufficient thickness to isolate each of the interconnect elements of the first redistribution layer 262 from other interconnect elements of the first redistribution layer 262. In one embodiment, the first and second passivation layers 272 and 274 are formed from the same dielectric material. For example, the first and second passivation layers may be formed from a solder resist layer or inorganic insulating material such as, but not limited to, silicon oxide (SiO2) and aluminum oxide (Al2O3). Providing first and second passivation layers having different dielectric materials may also be useful.

The semiconductor package 200a includes a shielding layer 250, which wraps around the entire second major surface 230b and sides of the encapsulant 230. As shown, a horizontal portion of the shielding layer 250 is separated from the die 110 by the encapsulant 230. In one embodiment, the shielding layer 250 extends beyond the top surface 230a of the encapsulant 230 to substantially cover the sides of the topmost passivation layer (e.g., second passivation layer 274). For example, the shielding layer 250 extends to cover the sides of the first and second passivation layers 272 and 274. Although a single-chip package is illustrated in FIG. 2a, it is understood that the encapsulant 230 may also be configured to accommodate additional semiconductor dies to provide a multi-chip package surrounded by the shielding layer 250.

Although the encapsulant 230 is illustrated to wrap around the active and inactive surfaces 110a and 110b of the semiconductor die 110, it is appreciated that the encapsulant 230 may also be formed to cover the active surface 110a and sides of the semiconductor die 110 without covering the inactive surface 110b of the semiconductor die 110. In an alternative embodiment, a semiconductor package 200b may include an encapsulant 230 configured with a second major surface 230b which is substantially coplanar with the inactive surface 110b of the semiconductor die 110, as shown particularly in FIG. 2b. In such case, the shielding layer 250 covers the second major surfaces 230b and 110b of the encapsulant 230 and the semiconductor die 110. As shown in FIG. 2b, the thickness of the encapsulant 230 is reduced as compared to the semiconductor package 200a shown in FIG. 2a.

FIG. 2c shows an alternative embodiment of the semiconductor package described in FIGS. 2a and 2b. The semiconductor package 200c shown in FIG. 2c is similar to that described in FIG. 2a. Common elements and features having the same reference numerals may not be described or described in detail. In the interest of brevity, the description of the semiconductor package shown in FIG. 2c below primarily focuses on the difference(s) compared with the package shown in FIG. 2a.

Referring to FIG. 2c, the semiconductor package 200c includes multiple redistribution layers. The redistribution layers extend across the die and non-die regions of the semiconductor package 200c. For example, the semiconductor package 200c includes an intermediate redistribution layer 264 sandwiched between a top redistribution layer 266 and a bottom redistribution layer 262. The bottom redistribution layer (RDL) 262 may be same as the first redistribution layer described in FIG. 2a. For example, the bottom redistribution layer 262 includes conductive traces (not shown) and first type contact pads 220 disposed in a first passivation layer 272. In one embodiment, the intermediate redistribution layer 264 includes conductive traces 224 and via contacts (not shown) disposed in a second passivation layer 274. For example, via contacts (not shown) disposed in the second passivation lay 275 provide interconnection between the intermediate redistribution layer 264 and the bottom and/or top redistribution layers 262 and 266. Other configurations of interconnect structures may also be useful. The second passivation layer 274, for example, includes a same dielectric material as the first passivation layer 272. Providing different dielectric materials for the first and second passivation layer may also be useful.

In one embodiment, the top redistribution layer 266 may be similar to the second redistribution layer described in FIG. 2a. For example, the top redistribution layer 266 includes second type contact pads 120 disposed in a third passivation layer 276. The second type contact pads 120 in the top redistribution layer 266, for example, includes copper or copper alloy. The third passivation layer 276 may include a different material to the first and second passivation layers 272 and 274. In one embodiment, the third passivation layer 276 is an encapsulant film. The third passivation layer 276, for example, includes a same molding material as the encapsulant 230. For example, the third passivation layer 276 is formed from by a thin epoxy resin layer. Other molding materials may also be useful. In one embodiment, the third passivation layer 276 is configured with a top surface that is coplanar with the top surface of the second type contact pads 120. For example, the third passivation layer 276 covers the sides of the second type contact pads 120. Other configurations of the third passivation layer 276 may also be useful. For example, the third passivation layer 276 may also be configured with a top surface that is higher than the top surface of the second type contact pads 120. The second type contact pads 220 serve as input/output (I/O) terminals of the semiconductor package 200c. Conductive traces 224 and via contacts in the second passivation layer 274 provide an interconnection between the first type contact pads 220 in the first passivation layer 272 and the second type contact pads 120 in the third passivation layer 276.

The semiconductor packages 200a, 200b and 200c described with respect to FIGS. 2a-2c include same or similar advantages associated with the shielding layer 250 as described with respect to FIG. 1a. As such, these advantages will not be described or described in detail. With respect to semiconductor package 200c, it further includes an encapsulant film (e.g., third passivation layer 276) surrounding sides of the I/O terminals (e.g., second type contact pads 120) of the semiconductor package 200c. Surrounding the second type contact pads 120 with an encapsulant film 276 provides several advantages. Firstly, the encapsulant film 276 advantageously protects the sides of the second type contact pads 120 from damage caused by, for example, mechanical stresses and oxidation. Secondly, the coefficient of thermal expansion (CTE) mismatch between a molding material of the encapsulant film 276 and the second type contact pad 120 is lower relative to CTE mismatch between other types of dielectric materials and the second type contact pad 120. As such, bending stresses can be avoided during thermal expansion. Lastly, the temperature for processing molding material is lower relative to other types of dielectric materials. Therefore, the semiconductor die 1μ will be exposed to less thermal stresses during manufacturing process.

FIGS. 3a-3i show cross-sectional views of an embodiment of a process 300 for forming a semiconductor package. The semiconductor package is, for example, same or similar to that described in FIGS. 1a-1d. For example, the process 300 forms a semiconductor package having a shielding layer 150 for EMI protection. In the interest of brevity, common elements and features having the same reference numerals may not be described or described in detail.

Figure 3A:
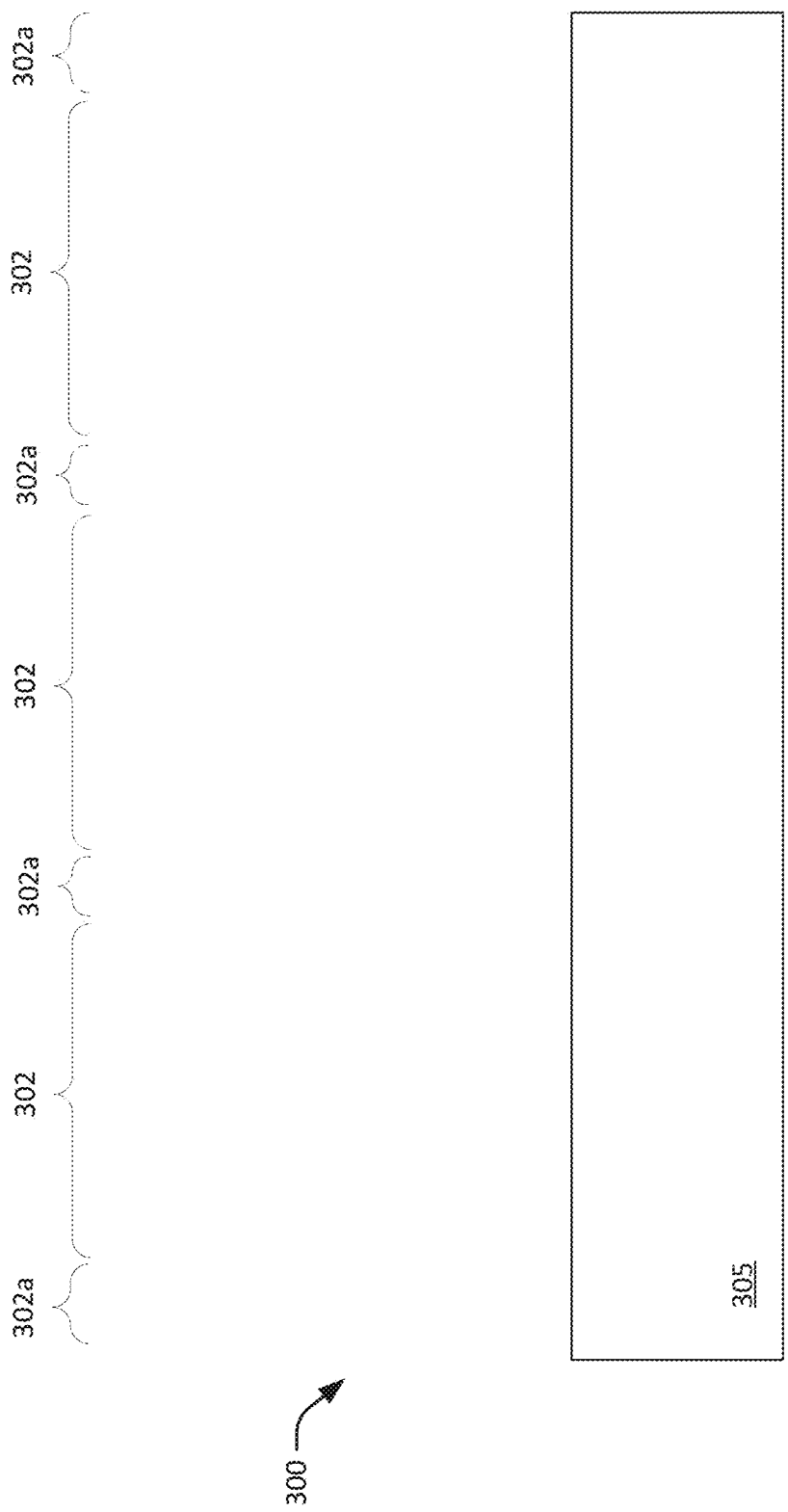

Referring to FIG. 3a, a base carrier 305 is provided. The base carrier, for example, is used for processing semiconductor packages. The base carrier, in one embodiment, should be sufficiently rigid to serve as a support for processing multiple semiconductor dies. For example, the base carrier 305 should be sufficiently rigid to reduce or prevent warpage of die assemblies during the assembly process. In one embodiment, the base carrier includes a conductive material. The base carrier 305 includes, for example, Cu or Cu alloy. Other suitable types of conductive material for the carrier may also be useful. In one embodiment, the base carrier 305 can be configured in a strip format to process a row of semiconductor dies. In another embodiment, the base carrier 305 may be configured to process a plurality of rows of semiconductor dies. For example, the base carrier 305 may have a panel format to form a 2 dimensional array of semiconductor packages. Providing a base carrier configured in a wafer format to form a plurality of packages may also be useful. The type of format selected may depend on, for example, the requirements of the process, available equipment or cost considerations.

In one embodiment, a plurality of active regions 302 are defined on the conductive carrier 305 to accommodate a corresponding number of semiconductor packages. Each active region 302, for example, corresponds to a region where a semiconductor package is to be formed. The active regions 302 are spaced apart from each other by inactive regions 302a. The inactive regions 302a may include dicing lanes. Each active region 302 of the base carrier 305 includes at least a die region 102a and a non-die region 102b surrounding the die region 102a. Alternatively, each active region 302 may include a plurality of die and non-die regions to accommodate multiple semiconductor dies 110. In such case, a semiconductor die may be spaced apart from another semiconductor die within the active region 302 by a non-die region.

Figure 3B:
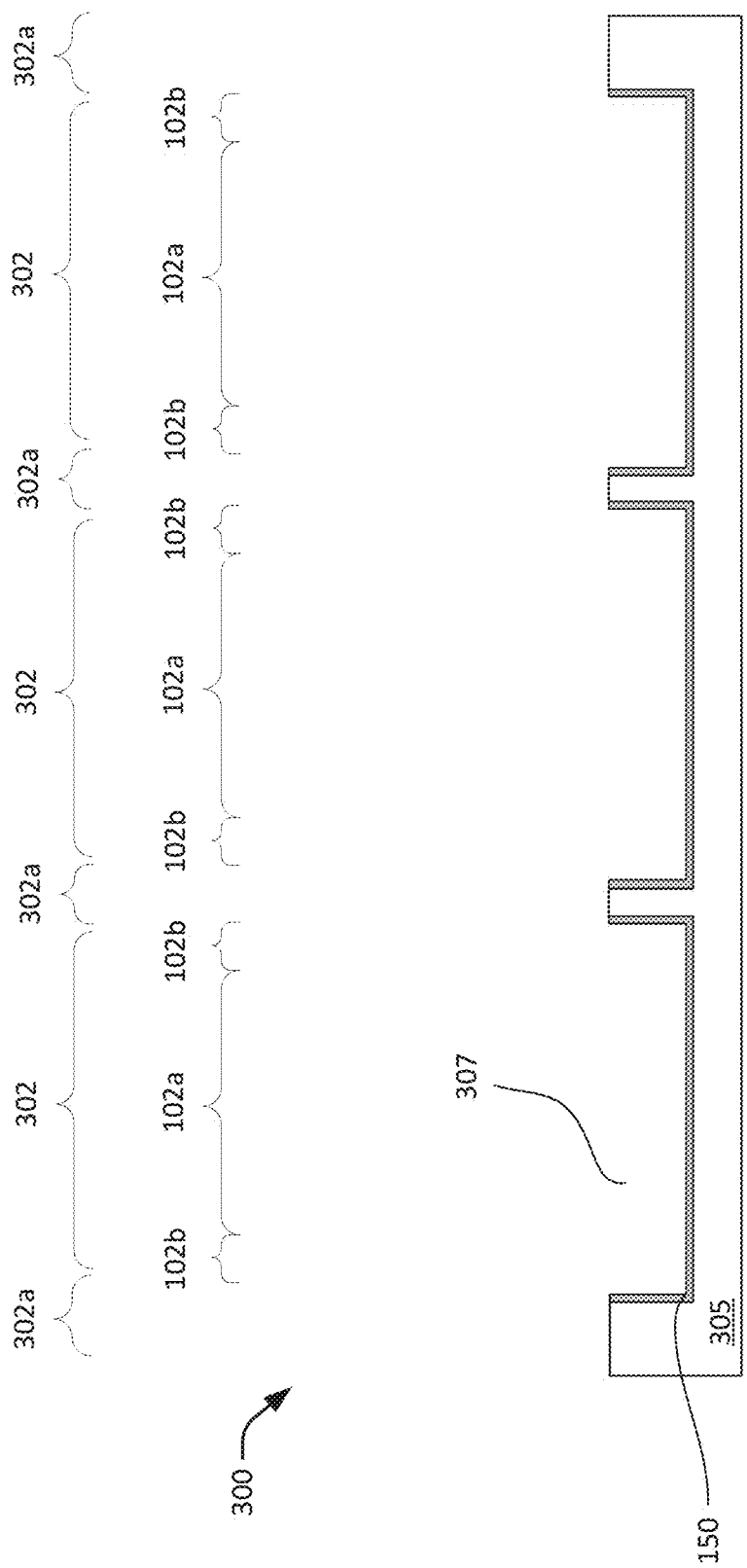

Referring to FIG. 3b, a cavity (or trench) 307 is formed in each of the active regions 302 of the conductive base carrier 305. The cavities may be formed by any suitable mask and etch techniques. For example, a patterned mask layer (not shown), such as a photoresist, is disposed on the conductive carrier 305 to selectively expose the active regions 302 of the base carrier. An etch process may be performed using the patterned mask layer as an etch mask to remove portions of the base carrier exposed by the etch mask. The etch, in one embodiment, may be an isotropic etch such as a wet etch. For example, a chemical etch may be performed to form cavities in the base carrier 305. Other suitable techniques may also be employed. The dimensions of the cavities, for example, correspond to the dimensions of the semiconductor packages to be formed.

In one embodiment, a shielding layer 150 is formed within the cavities 307. The shielding layer, for example, lines the sidewalls and bottom of the cavities 307. Alternatively, the shielding layer may be formed to line only the bottom surface of the cavities 307 without lining the sidewalls of the cavities to form a shielding layer similar to that described with respect to FIG. 1d. Other configurations of the shielding layer 150 may also be useful.

The shielding layer may include a conductive material. In one embodiment, the shielding layer 150 may be formed by any suitable deposition process such as, but not limited to, sputtering, evaporation, and plating (e.g., electroplating processes). For example, a conductive material such as NiAuPd or Ag is deposited within the cavities to form the shielding layer by sputtering technique. Other techniques for forming the shielding layer may also be useful.

Figure 3C:
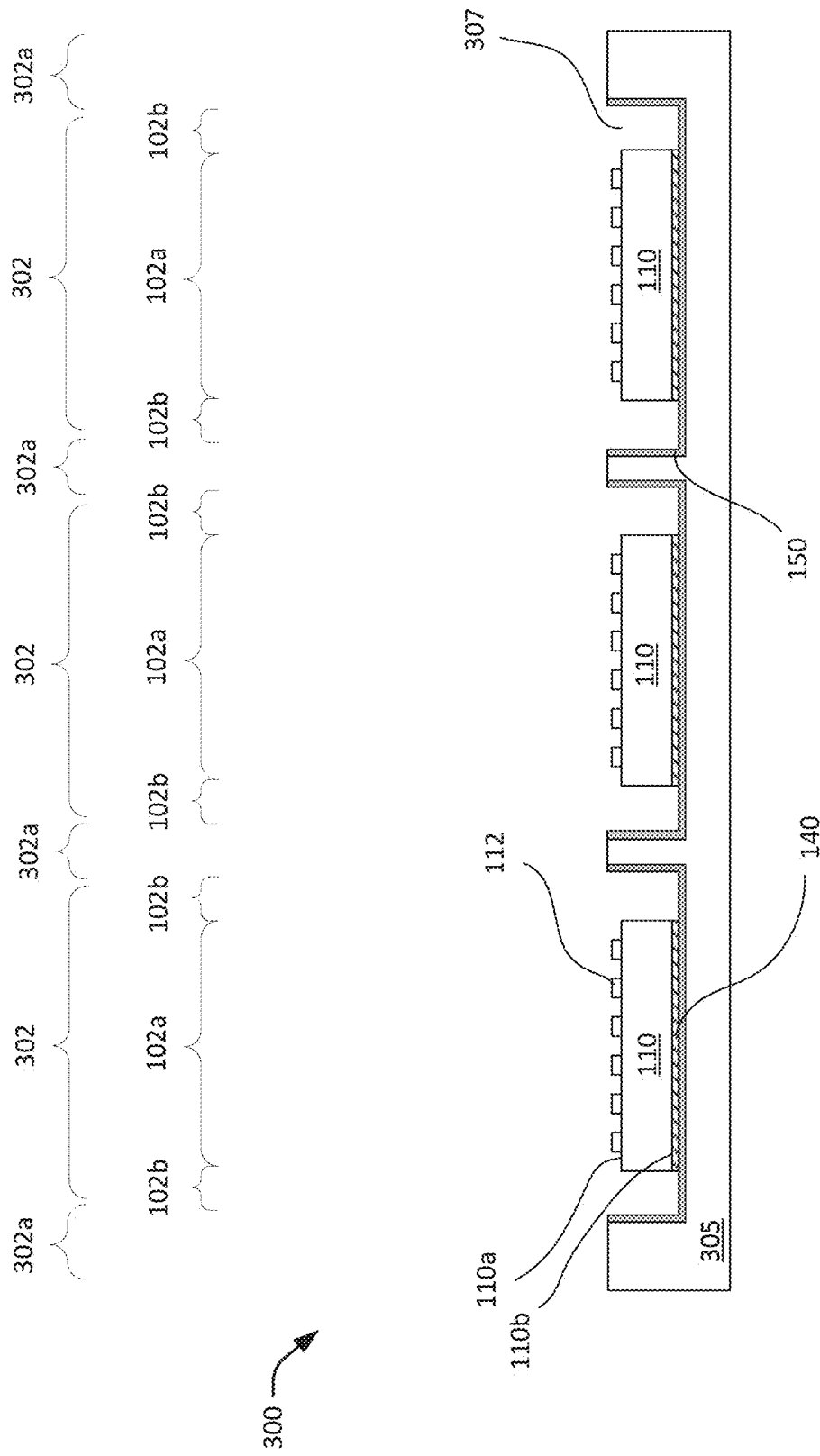

Referring to FIG. 3c, each of the cavities 307 are defined with die and non-die regions 102a and 102b. In one embodiment, a semiconductor die (or chip) 110 is disposed within each of the cavities 307 formed in the base carrier 305. The semiconductor dies may include die contacts 112 extending from die pads disposed in the active surface 110a of the semiconductor die. In embodiment, the die contacts 112 correspond to elongated metal bumps. For example, the die contacts 112 are defined by conductive posts (or pillars) extending from the die pads. Other configurations of die contacts 112 may also be employed. For example, the die contacts 112 may also be configured to correspond to spherical-shaped metal bumps (e.g., conductive balls).

The semiconductor dies 110 may be positioned centrally in the die region 102a of a cavity 307. The semiconductor dies, for example, are mounted to the horizontal portion of the shielding layer 150 in the die region 102a. The semiconductor dies 110 may be attached to the shielding layer 150 using a die attach layer 140. The die attach layer 140 is, for example, an adhesive in the form of paste, film or tape. Other suitable methods may also be used to attach the semiconductor die 110 to the shielding layer 150. Various adhesive materials, such as epoxy resin and polyimide may be used to form the die attach layer 140.

Figure 3D:
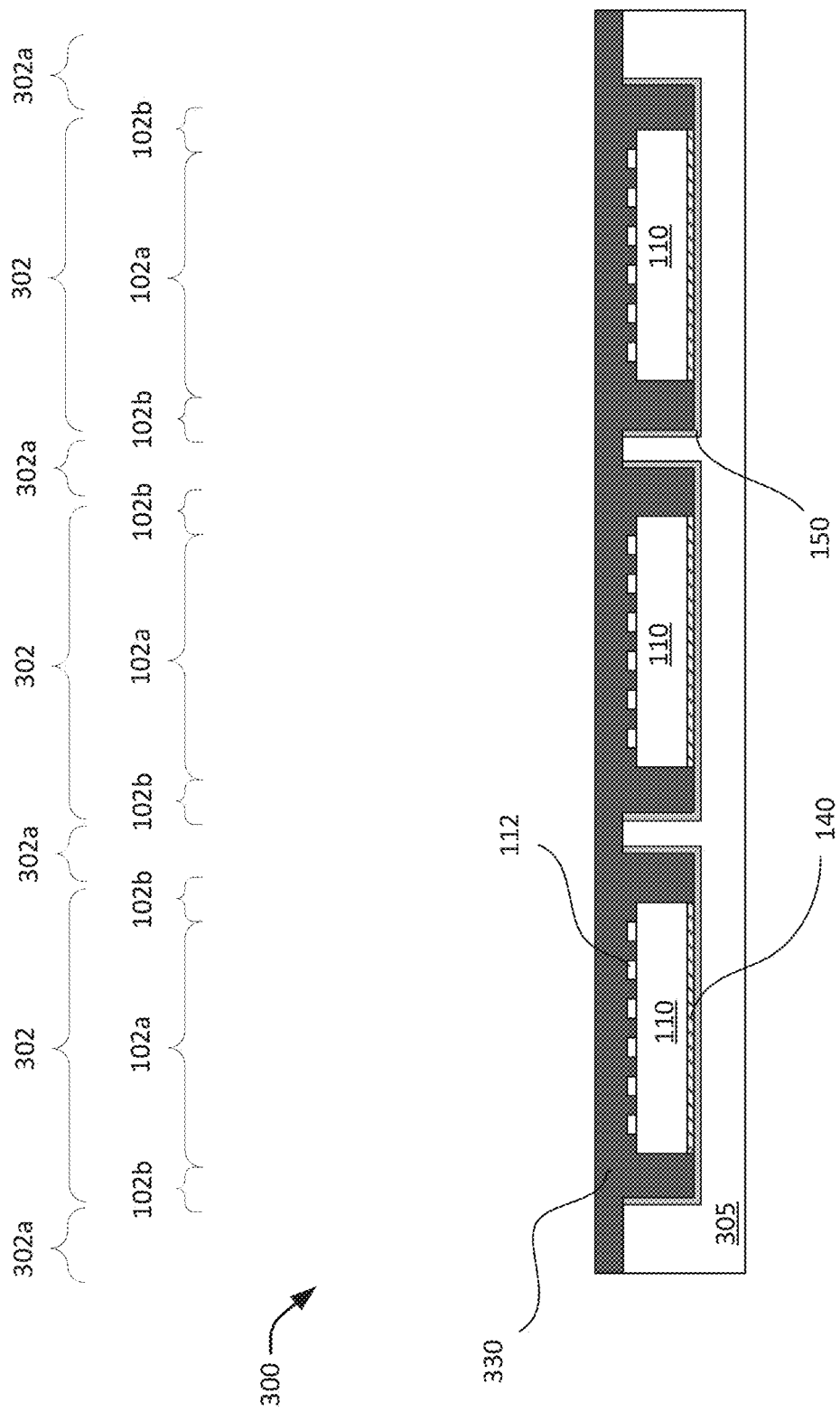

Referring to FIG. 3d, an encapsulant material 330 is disposed on the conductive carrier 305 to fill the cavities 307. The encapsulation material 330, for example, extends over and completely covers a top surface of the die contacts 112. The encapsulation material 330, for example, comprises a molding material such as, but not limited to, molding epoxy resin. The encapsulant material 330 may be dispensed by a liquid encapsulation process such as transfer, compression or injection molding. Other techniques may also be useful to dispense the encapsulant material 330. In one embodiment, the encapsulant material 330 extends beyond the cavities 307 and covers top surfaces of the die contacts 112 and the base carrier 305. For example, the top surface of the encapsulant material 330 extends above the top surface of the base carrier 305.

A rough nickel layer (not shown) may optionally be disposed in the cavities prior to forming the encapsulant material 330. For example, a nickel layer may be formed on the exposed portions of the shielding layer 150 which are not covered by the semiconductor dies. The nickel layer may be roughened by any suitable methods, including etching process. Forming a rough nickel layer on the shielding layer 150 improves bonding of the encapsulant material 330 to the metal material of the shielding layer 150. Other techniques and materials may also be employed to provide a rough (or sufficiently granulated layer) for improving bonding between the shielding layer 150 and encapsulant material 330.

Figure 3E:
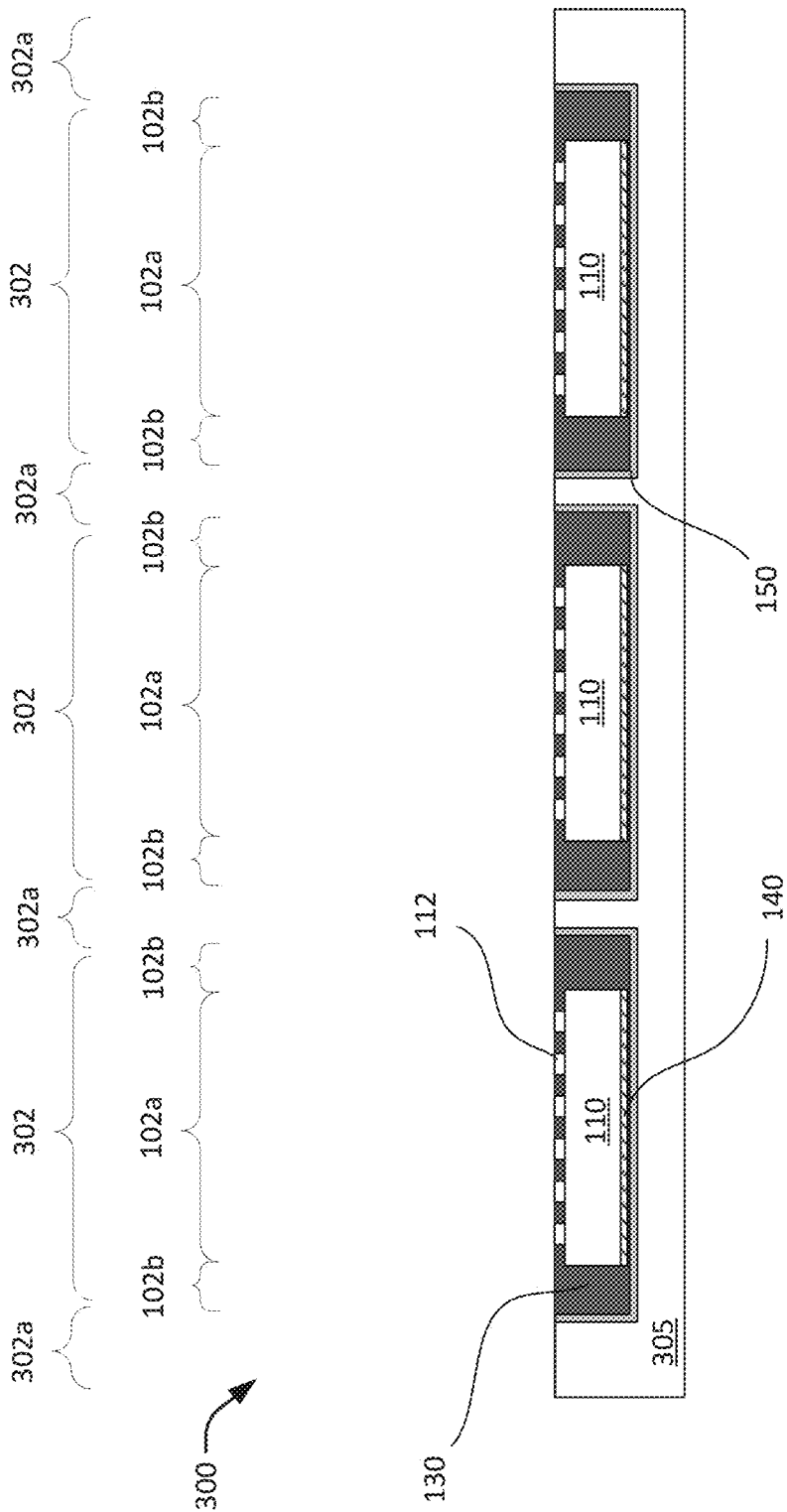

Referring to FIG. 3e, the process continues by removing excess encapsulant material 330 to expose the top surface of the die contacts 112. In one embodiment, the excess encapsulant material 330 is removed by a thinning process (or planarization process) to define a final thickness of the encapsulant 130. The thinning process may be any suitable thinning techniques. For example, a grinding process is performed on the top surface of the encapsulant 330 to reduce a thickness of the encapsulant material 330. Alternatively, chemical-mechanical planarization (CMP) processes may also be employed. In one embodiment, the thinning process forms an encapsulant 130 within each cavity 307 having a planar top surface which is substantially coplanar with a top surface of the die contacts 112. For example, the encapsulant 130 surrounds the die contacts 112 and exposes the top surface of the dies contacts 112.

Forming die contacts 112 which correspond to elongated metal bumps facilitates the thinning process for forming the encapsulant 130. For example, die contacts 112 configured in the form of conductive posts (or pillars) improves process control for performing a grinding process on the encapsulant 330 as compared to conductive balls.

Figure 3F:
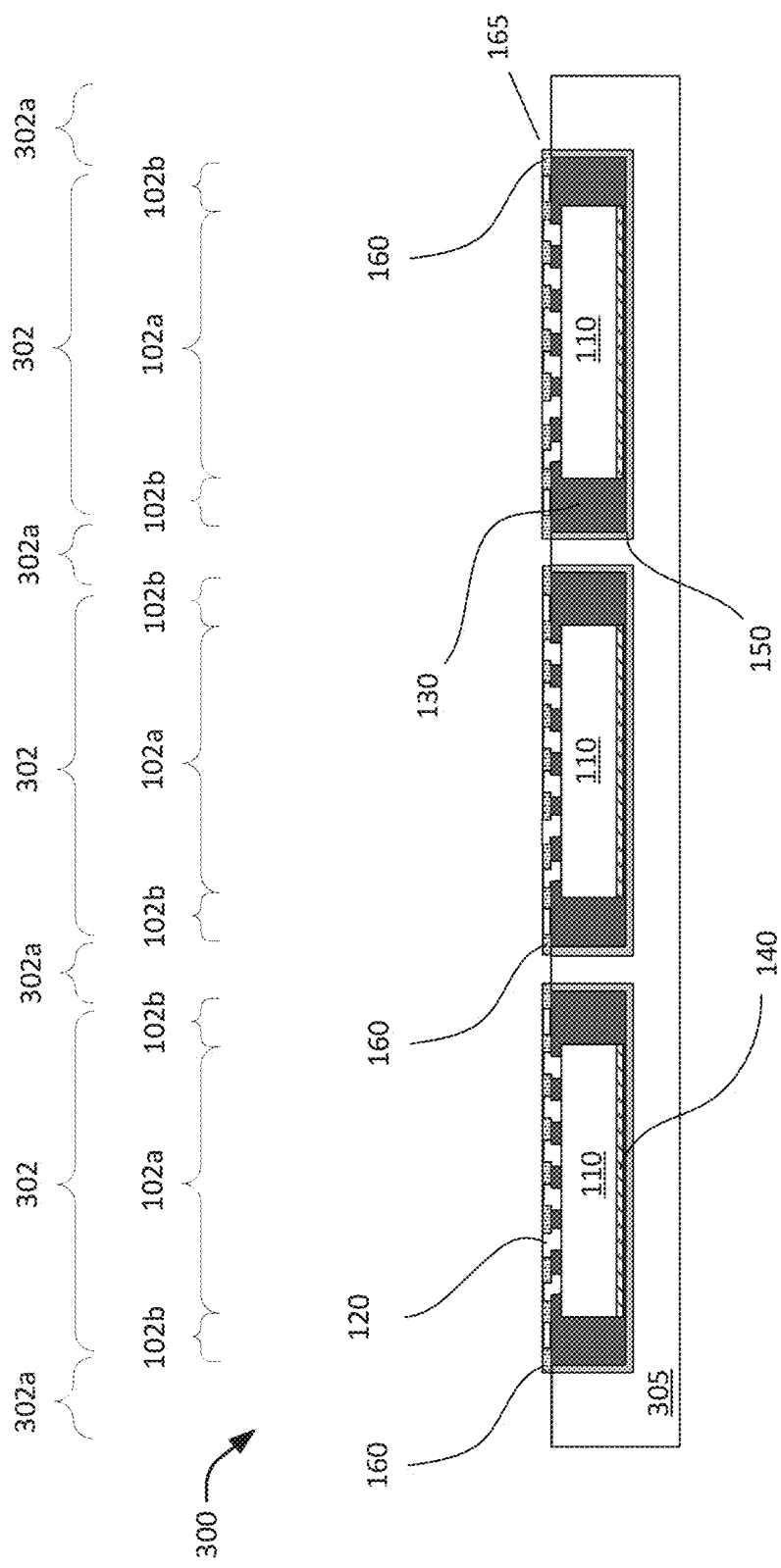

Referring to FIG. 3f, interconnect structures of a redistribution layer 165 are formed in the active regions 302 over the encapsulant 130. For example, conductive traces (not shown), first type contact pads (not shown) and second type contact pads 120 are formed. In one embodiment, the conductive traces and first and second type contact pads are formed of the same material. The conductive traces and contact pads are, for example, formed by plating processes. For example, electrochemical or electroless plating may be employed to form the conductive traces and the contact pads. The exposed top surface of the die contacts 112 thus also serves as a base or substrate for the plating process. In one embodiment, the conductive traces and contact pads may be formed by electrochemical plating in which the conductive carrier 305 provides a plating current conducting path in the process. Other suitable methods for forming the conductive traces and contact pads may also be useful.

A first passivation layer (not shown) may optionally be formed on the encapsulant 130 and base carrier 305 prior to forming interconnect structures of the redistribution layer 165. The first passivation layer may be formed by depositing a dielectric layer over the encapsulant 130 to cover the top surfaces of the die contacts 112 of the semiconductor dies 110 and patterning the dielectric layer to selectively expose top surfaces of the die contacts 112. Patterning of the dielectric layer can be achieved by any suitable etching techniques. For example, a patterned etch mask (not shown), such as a photoresist, is provided over the dielectric layer to remove portions of the optional first passivation layer by etching. The optional first passivation layer may be provided to selectively cover top surfaces of particular die contacts 112 to enable reconfiguration of the interconnect patterns of the redistribution layer 165. The optional first passivation layer may also be provided to selectively form wider conductive traces in the redistribution layer 165.

After forming interconnect structures of the redistribution layer 165, the process continues to form a passivation layer 160 over the encapsulant 130. In one embodiment, the passivation layer 160 fills the spaces between the interconnect structures. For example, the passivation layer 160 covers exposed top surface portions of the encapsulant 130. The passivation layer, for example, includes a dielectric material such as solder mask or inorganic insulating material including silicon oxide and aluminum oxide material. Other suitable types of dielectric material may also be used. The passivation layer 160 may be formed by any suitable techniques including deposition or lamination techniques. In one embodiment, the passivation layer may correspond to a patterned dielectric layer. For example, a dielectric layer is deposited over the base carrier 305 in the active and non-active regions 302 and 302a. The dielectric layer is patterned using mask and etch techniques to form the passivation layer 160 in the active regions 302. For example, a patterned etch mask (not shown), such as a photoresist, is provided over the dielectric layer to expose portions of the dielectric layer in the non-active regions 302a and protect portions of the dielectric layer in the active regions 302 from an etching process. Other techniques may also be useful for forming the passivation layer 160. The passivation layer 160 is formed with sufficient thickness to surround sides of the second type contact pads 120 and expose a top surface of the second type contact pads 120.

Although a single redistribution layer is illustrated, it is understood that the process described in FIG. 3f may optionally be repeated to form multiple redistribution layers.

Figure 3G:
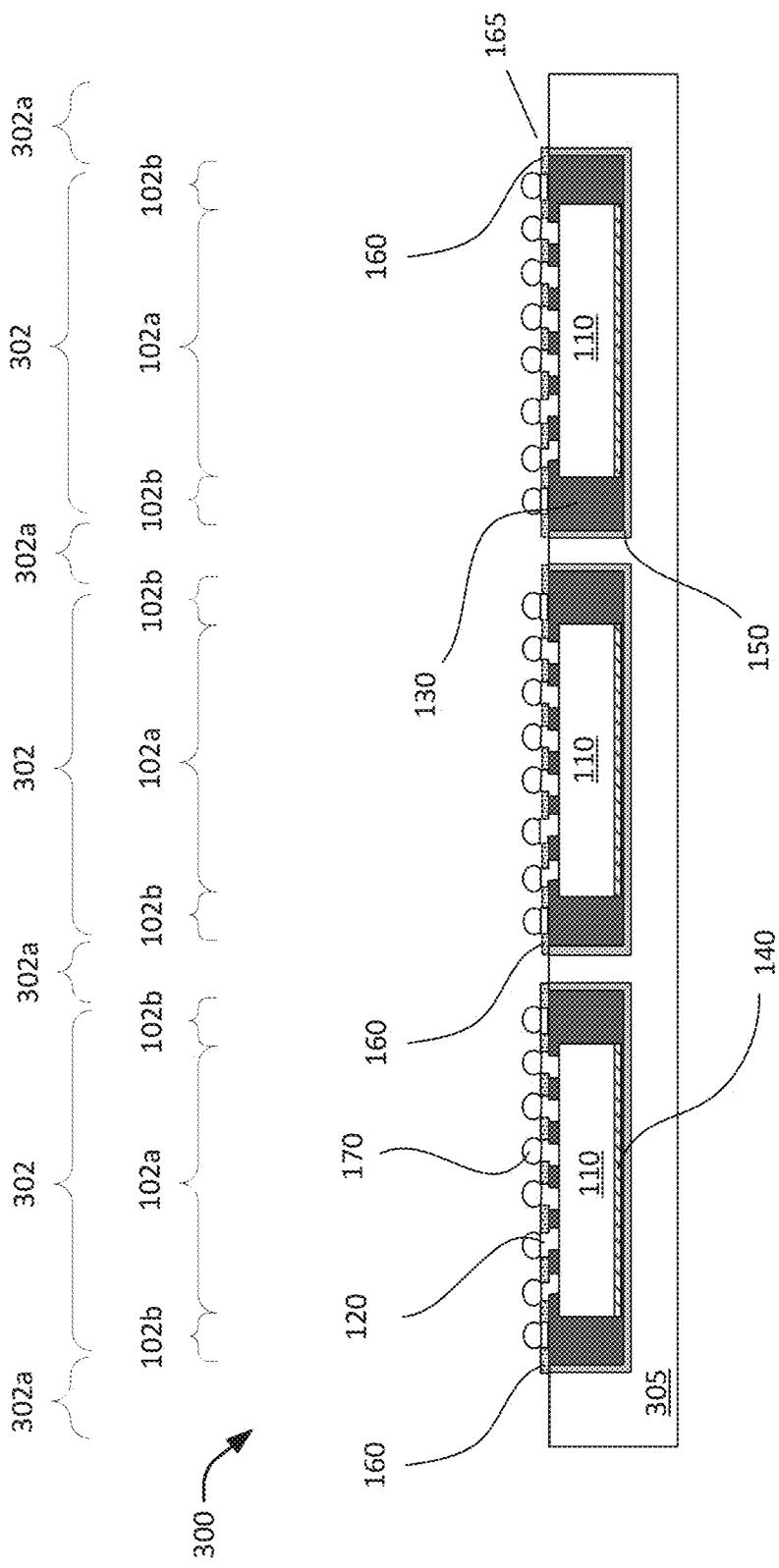

Referring to FIG. 3g, package contacts 170 are formed on the second type contact pads. The package contacts, for example, includes spherical shaped bumps. The package contacts may be formed from solder material. Various types of solder can be used to form the package contacts. For example, the solder can be a lead-based or non lead-based solder. The package contacts 160 may be formed by various techniques such as ball drop, screen printing and plating. Providing other types of package contacts, such as solder lands, may also be useful. Other techniques and materials may also be used to form the package contacts 160. As shown, the process described in FIGS. 3a-3f forms a strip (or a panel) of semiconductor packages.

Referring to FIG. 3h, a support carrier 380 having top and bottom surfaces is provided. The support carrier, for example, provides a temporary support for processing the base carrier 305. By way of non-limiting example, the support carrier 380 may be a silicon wafer, conductive tape or the like. In one embodiment, an adhesive agent (not shown) is provided on the top surface of the support carrier 380 to facilitate temporary bonding of the base carrier 305 to the support carrier 380. Other temporary bonding techniques may also be useful. The adhesive agent may be in different forms including tape, liquid or paste. The adhesive agent may be provided on the top surface of the support carrier using various techniques depending on the type or form of the adhesive agent. For example, a tape adhesive may be provided on the support carrier 380 by lamination, a paste adhesive may be provided on the support carrier by printing while a liquid adhesive may be provided on the substrate by spin coating.

In one embodiment, a wet etching technique is performed to completely remove the base carrier 305. For example, the etching process includes an etchant for etching a base carrier having copper material. The wet etch is, for example, a chemical etch. Other suitable etching process may also be employed. The etching process completely removes the base carrier 305 to form singulated semiconductor packages separated by gaps. For example, a plurality of singulated semiconductor packages remains on the support carrier 380 after etching the base carrier 305.

Figure 3I:
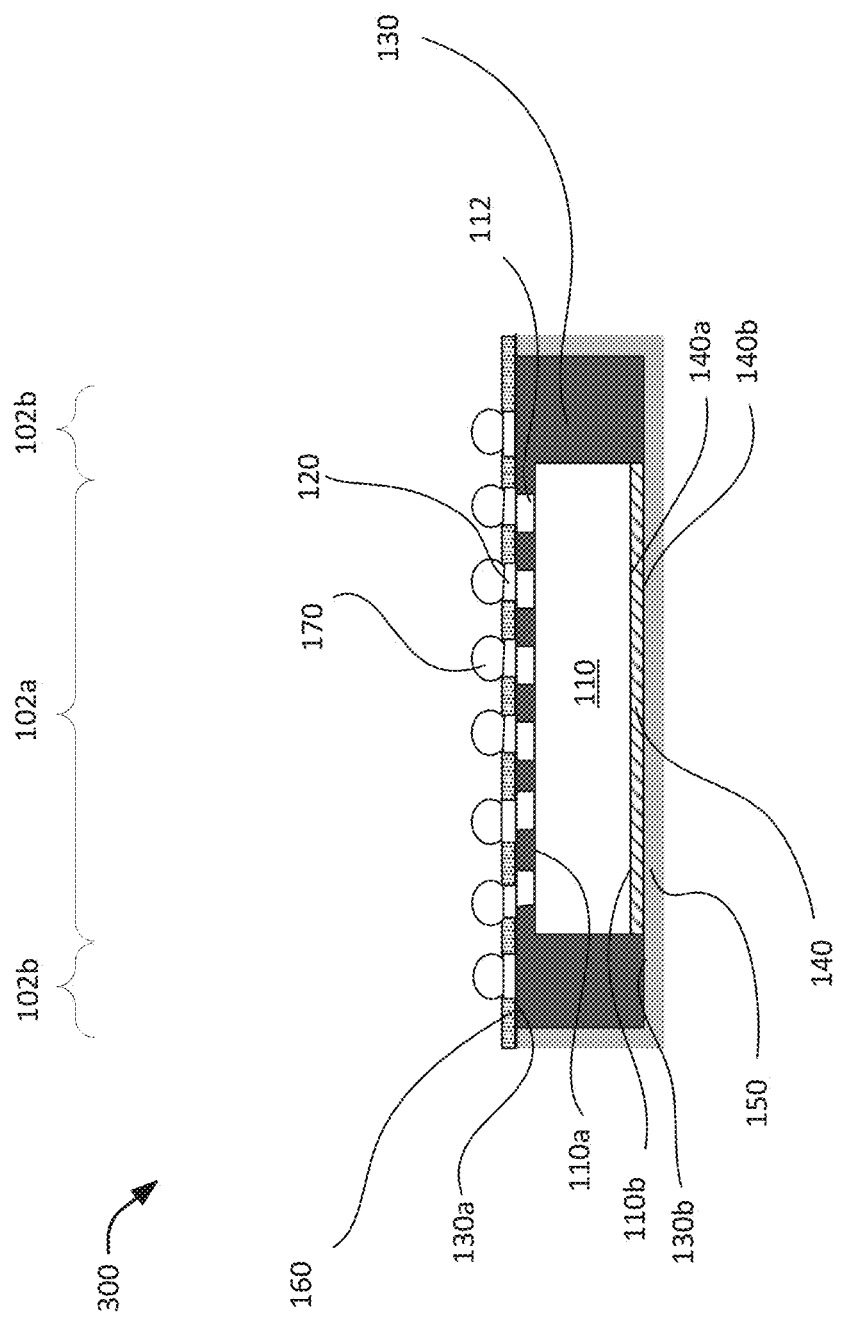

In one embodiment, the singulated semiconductor packages are detached from the support carrier 380 to complete the process 300 of forming individual semiconductor packages having a shielding layer 150, as shown particularly in FIG. 3i. For example, the semiconductor packages may be detached by physically pulling away (e.g., ripping) each semiconductor package from the support carrier 380. Other techniques for removing the semiconductor packages from the support carrier 380 may also be useful. The process 300, for example, forms semiconductor packages same or similar to that described in FIG. 1a.

FIGS. 4a-4b show cross-sectional views of yet another embodiment of a process 400 for forming a semiconductor package. The semiconductor package is, for example, same or similar to that described in FIG. 1c. For example, the process 400 forms a semiconductor package having EMI protection. The process 400 may be similar to that described in FIGS. 3a-3i. In the interest of brevity, common elements and features having the same reference numerals may not be described or described in detail.

Referring to FIG. 4a, a partially processed semiconductor package is provided. The partially processed semiconductor package is at the stage of processing described in FIG. 3c. For example, a semiconductor die (or chip) 110 is disposed within each of the cavities 307 formed in the base carrier 305. The semiconductor dies, for example, are mounted to the horizontal portion of the shielding layer 150 in the die region 102a. The semiconductor dies may be attached to the shielding layer 150 using a die attach layer 140. The die attach layer 140 is, for example, an adhesive in the form of paste, film or tape. Other suitable methods may also be used to attach the die 110 to the shielding layer 150.

In one embodiment, vertical interconnect structures 412 are disposed in the non-die region 102b of the cavities 307. The vertical interconnect structures are, for example, disposed between each of the dies 110 and a sidewall of the cavities 307. In one embodiment, the vertical interconnect structures 412 are formed by extruding conductive bumps to form metal pillars (or posts). For example, the vertical interconnect structures may be formed by bonding metal wires to the horizontal portions of the shielding layer 150 using wire bonding techniques. Other suitable techniques may also be used. The vertical interconnect structures 412 may extend from the shielding layer 150 to a height substantially same or similar to a height of the top surface of the base carrier 305. Materials used to form the vertical interconnect structures include Au, Cu, Al, their alloys, and solder materials. The vertical interconnect structures 412 may correspond to the ground connectors 192 described with respect to FIG. 1c.

Referring to FIG. 4b, an encapsulant material 330 is disposed on the base carrier 305 to fill the cavities 307. For example, the encapsulation material 330 is dispensed to encapsulate the semiconductor dies 110, die contacts 112 and vertical interconnect structures 412. In one embodiment, the encapsulant material 330 covers top surfaces of the base carrier 305, die contacts 112 and vertical interconnect structures 412. For example, the top surface of the encapsulant material 330 extends above the top surface of the base carrier 305.

The process continues, as similarly described in FIGS. 3e-3i, to form the encapsulant 130, the redistribution layer 165 and package contacts 170. As such, these process steps will not be described or described in detail. The process continues until individual semiconductor packages same or similar to that shown in FIG. 1c are formed.

FIGS. 5a-5i show cross-sectional views of another embodiment of a process 500 for forming a semiconductor package. The semiconductor package is, for example, same or similar to that described in FIGS. 2a-2c. For example, the process 500 forms a semiconductor package having EMI protection. The process 500 may be similar to that described in FIGS. 3a-3i. In the interest of brevity, common elements and features having the same reference numerals may not be described or described in detail.

Figure 5A:
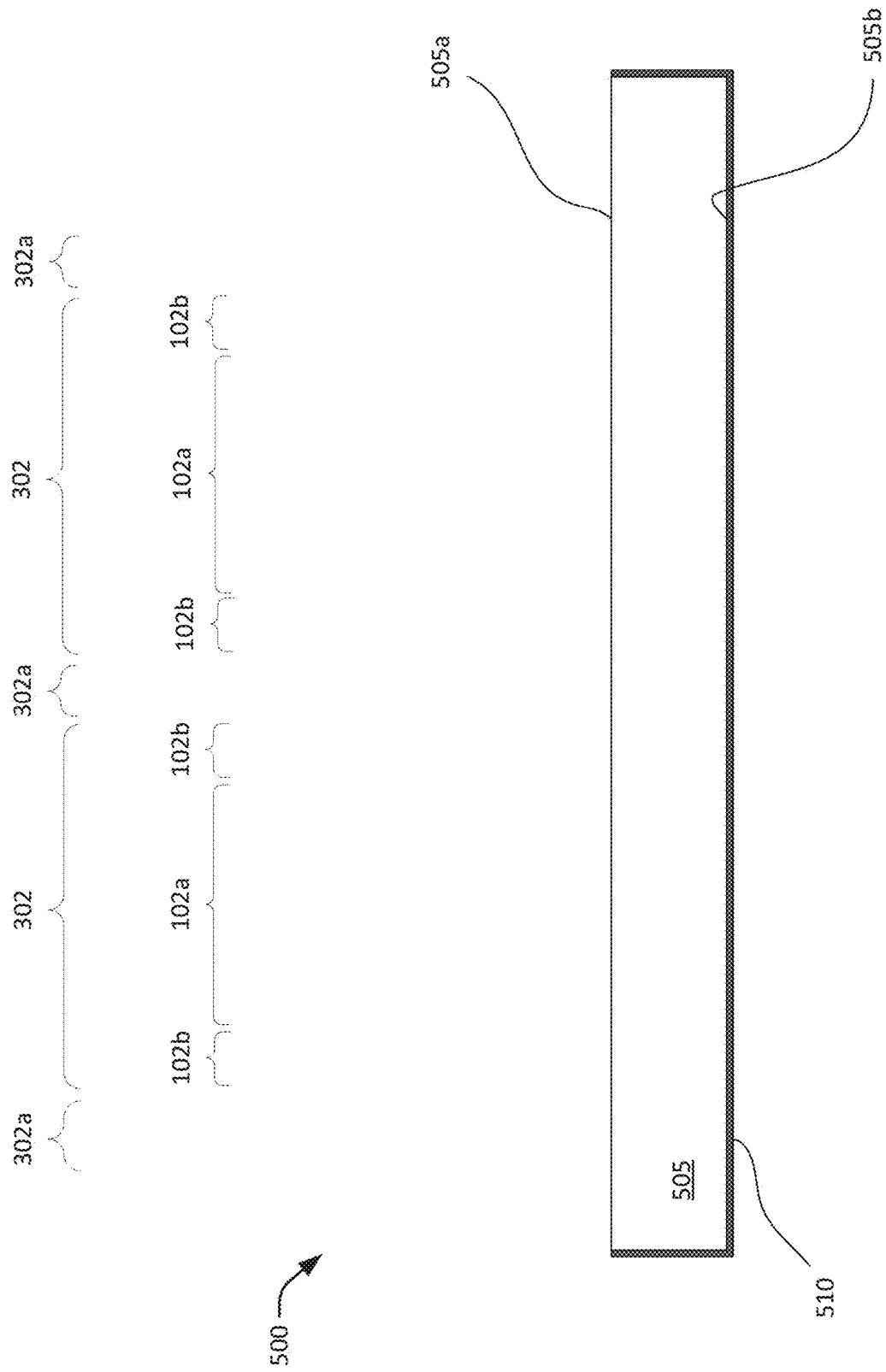

Referring to FIG. 5a, a base carrier 505 is provided. The base carrier, for example, is used for processing chip packages. In one embodiment, the base carrier includes a conductive material. The base carrier 505 includes, for example, Cu or Cu alloy. Other suitable types of conductive material for the base carrier may also be useful. The base carrier 505 can be configured in a strip format to process a row of dies. In another embodiment, the base carrier 505 is configured to process a plurality of rows of dies. For example, the base carrier 505 may have a panel format to form a 2 dimensional array of packages. Providing a base carrier 505 configured in a wafer format to form a plurality of packages may also be useful. The type of format selected may depend on, for example, the requirements of the process, available equipment or cost considerations. In one embodiment, a plurality of active regions 302 are defined on the base carrier 505 to accommodate a corresponding number of semiconductor packages. The active regions 302 are, for example, spaced apart from each other by inactive regions 302a.

The base carrier 505 includes first and second major surfaces 505a and 505b. For example, the first major surface 505a may be the top surface of the base carrier where one or more redistribution layers are to be formed, while the second major surface 505b may be the bottom surface of the carrier. In one embodiment, the base carrier 505 is prepared with an etch stop (or barrier) layer 510. The barrier layer 510, for example, lines the bottom surface 505b and sides of the base carrier 505 without extending to the top surface 505a of the base carrier 505. For example, the top surface 505a of the base carrier 505 is completely exposed. The barrier layer 510, in one embodiment, is a conductive layer. For example, the barrier layer 510 includes metal materials such as nickel, steel or an alloy thereof. The barrier layer 510 may be formed by any suitable deposition process such as, but not limited to, sputtering, evaporation and plating. The barrier layer is deposited to wrap around the bottom surface 505b and sides of the base carrier 505. Other techniques and materials may also be employed to form the barrier layer 510. For example, non-conductive material, such as polymer material, may also be employed to form the barrier layer 510.

Figure 5B:
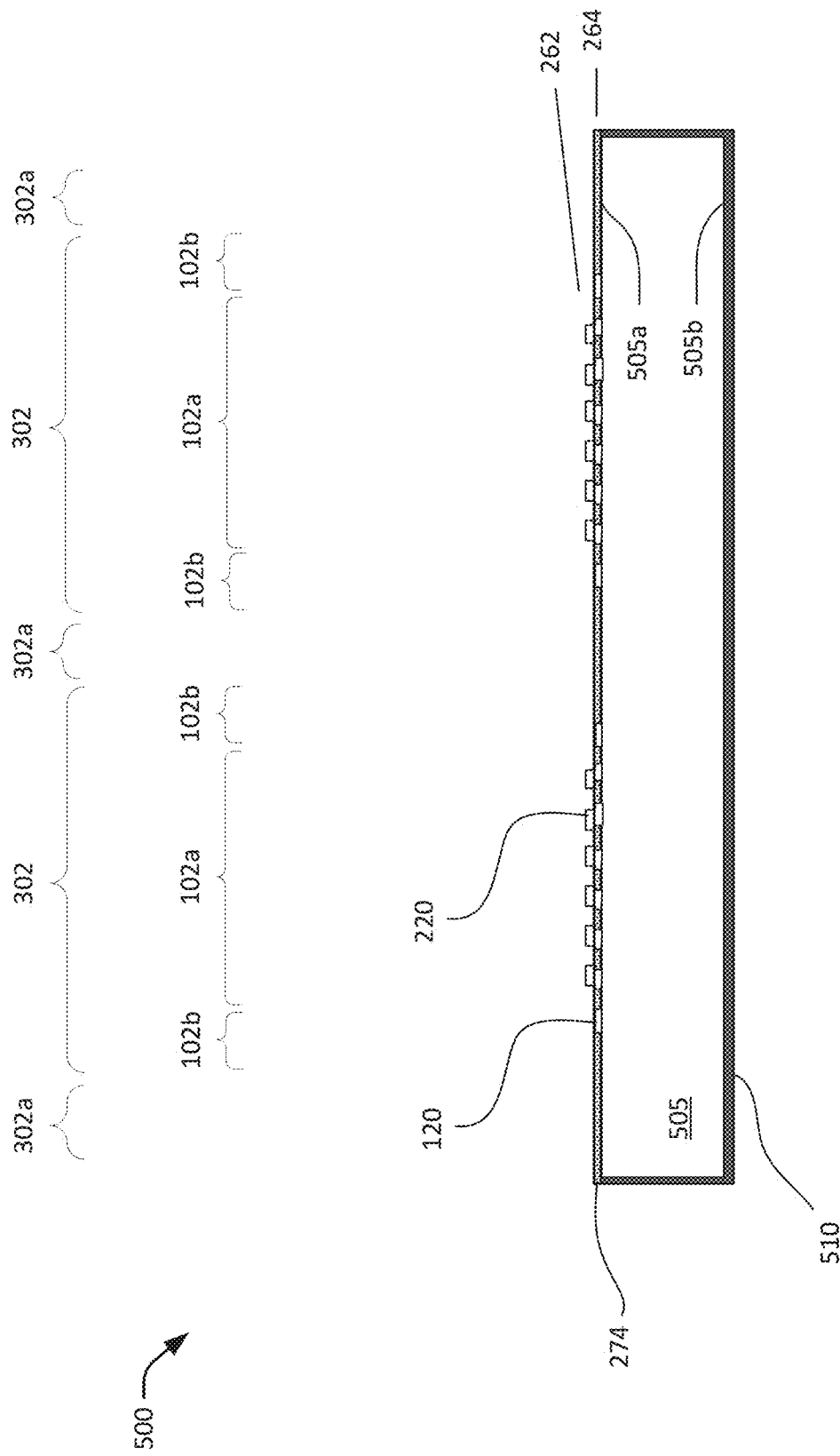

Referring to FIG. 5b, a first passivation layer 274 is formed on the exposed top surface 505a of the base carrier 505. In one embodiment, the first passivation layer 274 covers the entire top surface 505a of the base carrier 505. The first passivation layer, for example, includes a dielectric material such as solder mask or inorganic insulating material. The first passivation layer 274 may be formed by any suitable techniques including deposition or lamination techniques. Other types of dielectric materials and techniques may also be useful for forming the first passivation layer 274. In one embodiment, the first passivation layer 274 is patterned to form openings at locations corresponding to where interconnect structures of a first redistribution layer 264 are to be formed. For example, the passivation layer 274 is patterned by mask and etch techniques, to form openings at locations corresponding to where second type contact pads 120 are to be formed.

The process continues to form second type contact pads 120 in the openings of the patterned first passivation layer 274. For example, a conductive material, such as tungsten, copper, aluminum, or any alloy thereof, is deposited on the patterned passivation layer 274 to fill the openings. The conductive material may be deposited by any suitable deposition processes such as, but not limited to, plating and evaporation. Other techniques may also be useful. The second type contact pads 120 may serve as I/O terminals of a semiconductor package.

In one embodiment, the process continues to form interconnect structures of a second RDL layer (or level) 262 over the first RDL 264. For example, the second RDL 262 includes conductive traces (not shown), via contacts (not shown), and first type contact pads 220. In one embodiment, a conductive layer is deposited on the first passivation layer 274 to cover the top surfaces of the underlying passivation layer 274 and second type contact pads 120. The conductive layer may be patterned by any suitable mask and etch techniques including wet etch technique to form the interconnect structures (e.g., conductive traces, via contacts, first type contact pads 220) of the second RDL 262.

Figure 5C:
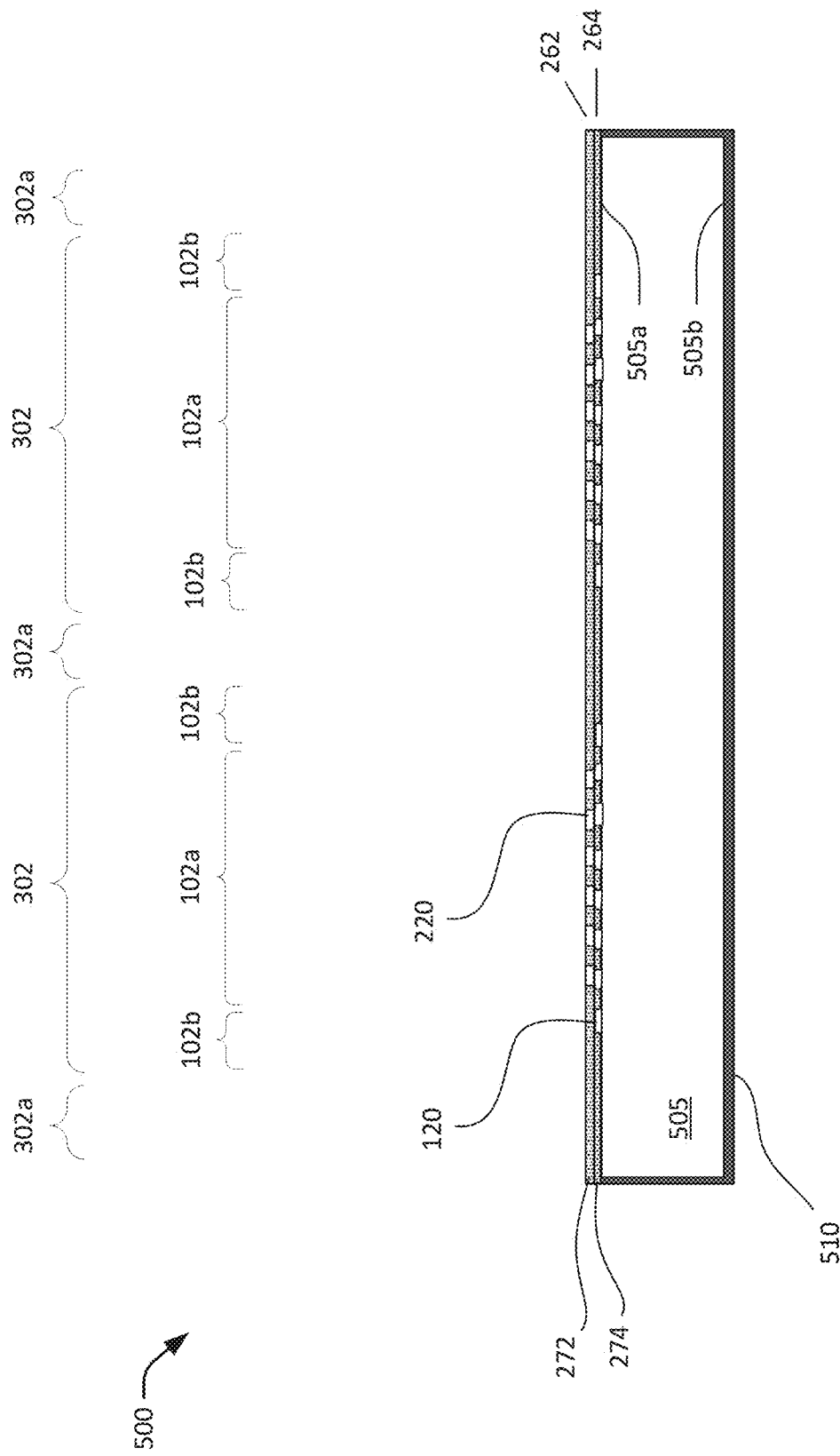

Referring to FIG. 5c, a second passivation layer 272 is formed over the first passivation layer 274 to insulate the interconnect structures of the second RDL 262. The second passivation layer 272, for example, covers the top surfaces of the underlying passivation layer 274 and the second type contact pads 120. The first and second passivation layers 272 and 274 may include a same dielectric material. The second passivation layer 272, for example, includes solder mask or inorganic insulating material. The second passivation layer 272 may be formed by any suitable techniques including deposition or lamination techniques. Other types of dielectric materials and techniques may also be employed. The second passivation layer 272 includes a sufficient thickness to surround sides of the first type contact pads 220. For example, the second passivation layer 272 surrounds the first type contact pads 220 without covering a top surface of the first type contact pads 220.

It is understood that the process described with respect to FIG. 5b may optionally be repeated to form additional redistribution layers and passivation layers over the second redistribution layer. For example, the second redistribution layer 262 may be an intermediate redistribution layer.

Figure 5D:
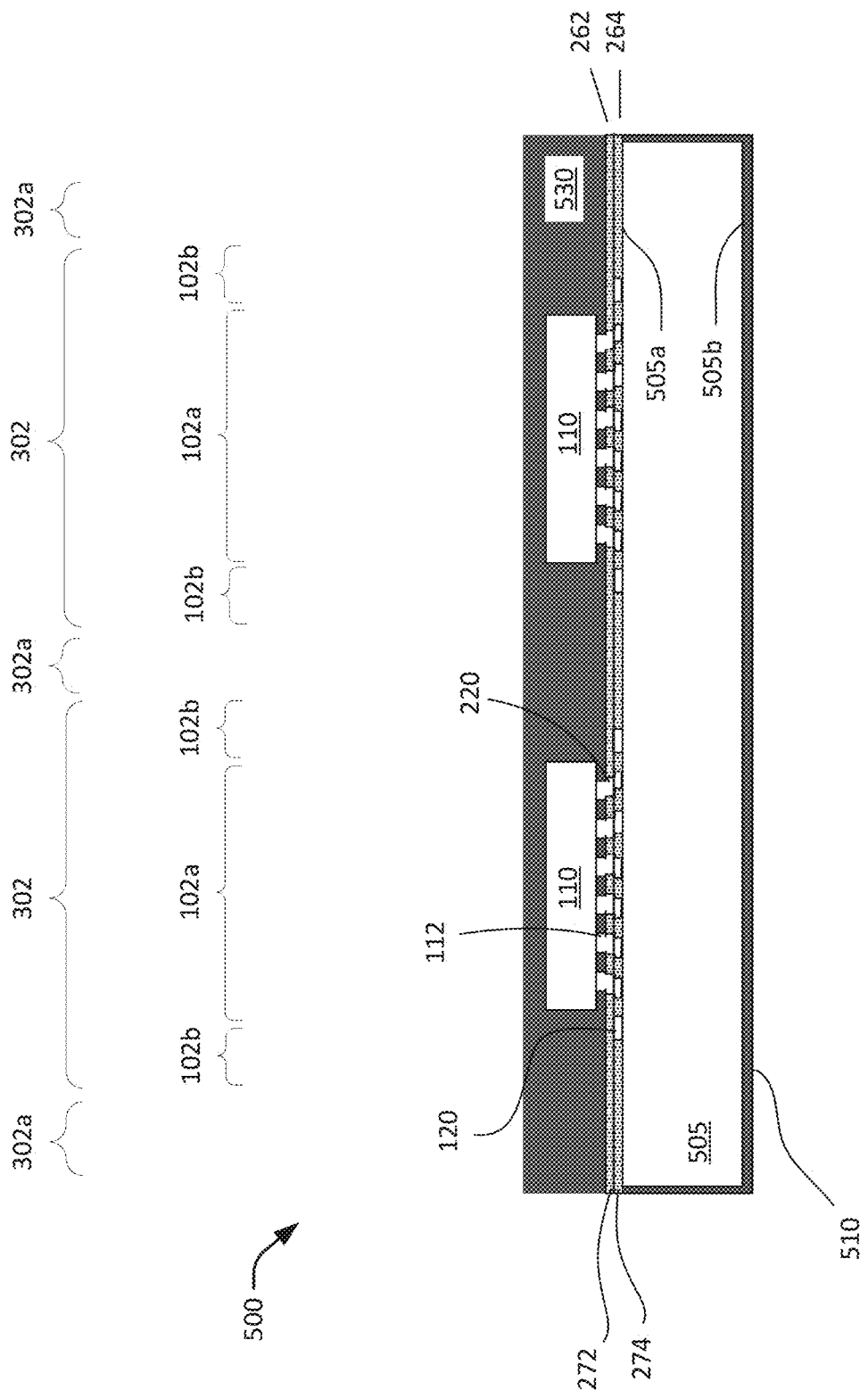

Referring to FIG. 5d, a plurality of semiconductor dies 110 are mounted onto the first type contact pads 220 in the second passivation layer 272. For example, a semiconductor die 110 is disposed in each die region 102a of the passivation layer 272. In one embodiment, the semiconductor dies 110 are mounted such that the die contacts 112 are electrically connected to the first type contact pads 220 disposed in the second passivation layer 272. For example, the first type contact pads 220 in the second passivation layer 272 are configured to match the pattern of the die contacts 112 of the semiconductor dies 110.

In one embodiment, a layer of encapsulant 530 is formed on the second passivation layer 272 to encapsulate the semiconductor dies 110 in the active regions 302. For example, encapsulation material is dispensed onto the second passivation layer 272 to encapsulate the semiconductor dies 110 and die contacts 112. In one embodiment, the encapsulation 530 includes mold material, such as molding epoxy resin. Providing other types of encapsulation material may also be useful. The encapsulant 530 may be formed by a liquid encapsulation process such as transfer, compression or injection molding. Other techniques or materials may also be useful to form the encapsulant 530. In one embodiment, the encapsulant 530 surrounds the semiconductor dies 110 and covers the inactive surfaces of the semiconductor dies 110. The encapsulant 530, for example, contacts the active and inactive surfaces of the semiconductor dies 110, and the sides of the semiconductor dies.

Although an encapsulant 530 is illustrated as wrapping around the active and inactive surfaces of the semiconductor dies, it is understood that a thinning process may optionally be performed to reduce a thickness of the encapsulant 530 and expose the inactive surface of the semiconductor dies 110. For example, a grinding process or polishing process (e.g., CMP) may be employed to provide a thinner encapsulant having a planar top surface that is coplanar to the inactive surfaces of the semiconductor dies 110, similar to that shown in FIG. 2b. Other configurations of encapsulant 530 may also be useful. Providing a thinner encapsulant 530 advantageously reduces a thickness of the resulting semiconductor package.

Figure 5E:
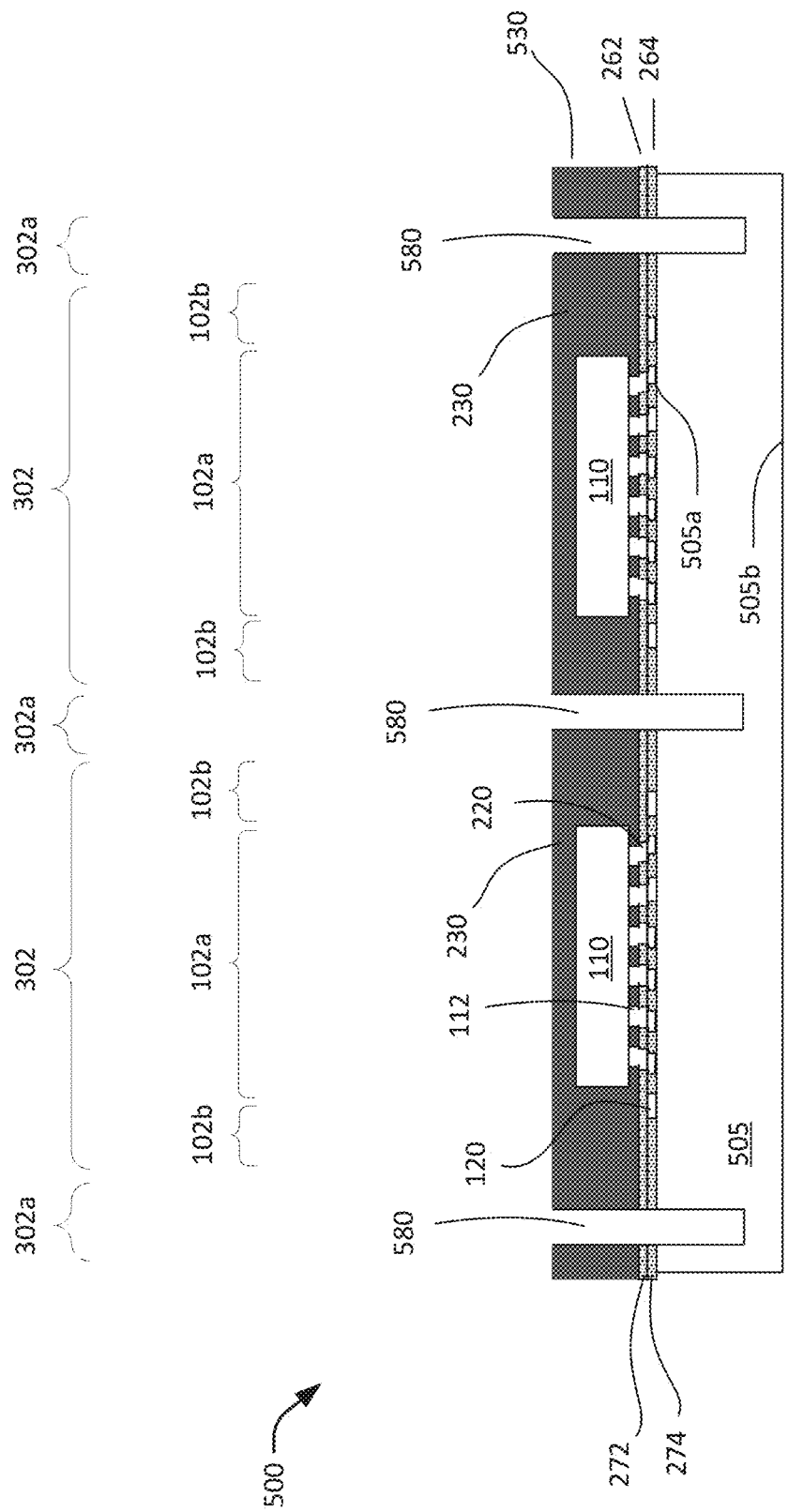

Referring to FIG. 5e, the barrier layer 510 is removed from the sides and second major surface 505b of the base carrier 505. For example, an etching process is employed to remove the barrier layer. Removing the barrier layer 510 exposes the sides and bottom surface 505b of the base carrier 505 for subsequent processing.

In one embodiment, a first singulation process is performed to form cut slots 580 extending through the encapsulant 530 and first and second passivation layers 272 and 274 in the non-active regions 302a. The cut slots 580, for example, extends partially through the base carrier 505. The first singulation process delineates portions of the encapsulant 530 corresponding to the encapsulant 230 for individual semiconductor packages. For example, the first singulation process partially singulates the semiconductor packages disposed in the active regions 302 of the base carrier 505 without cutting through the base carrier 505. In one embodiment, the base carrier 505 provides mechanical support for the first singulation process. The first singulation process may include a dicing device such as a saw. For example, the base carrier 505 is half-cut by sawing through the encapsulant 530 and the first and second passivation layers 272 and 274, and sawing partially through the base carrier 505. Other techniques for performing the first singulation process may also be employed.

Figure 5F:
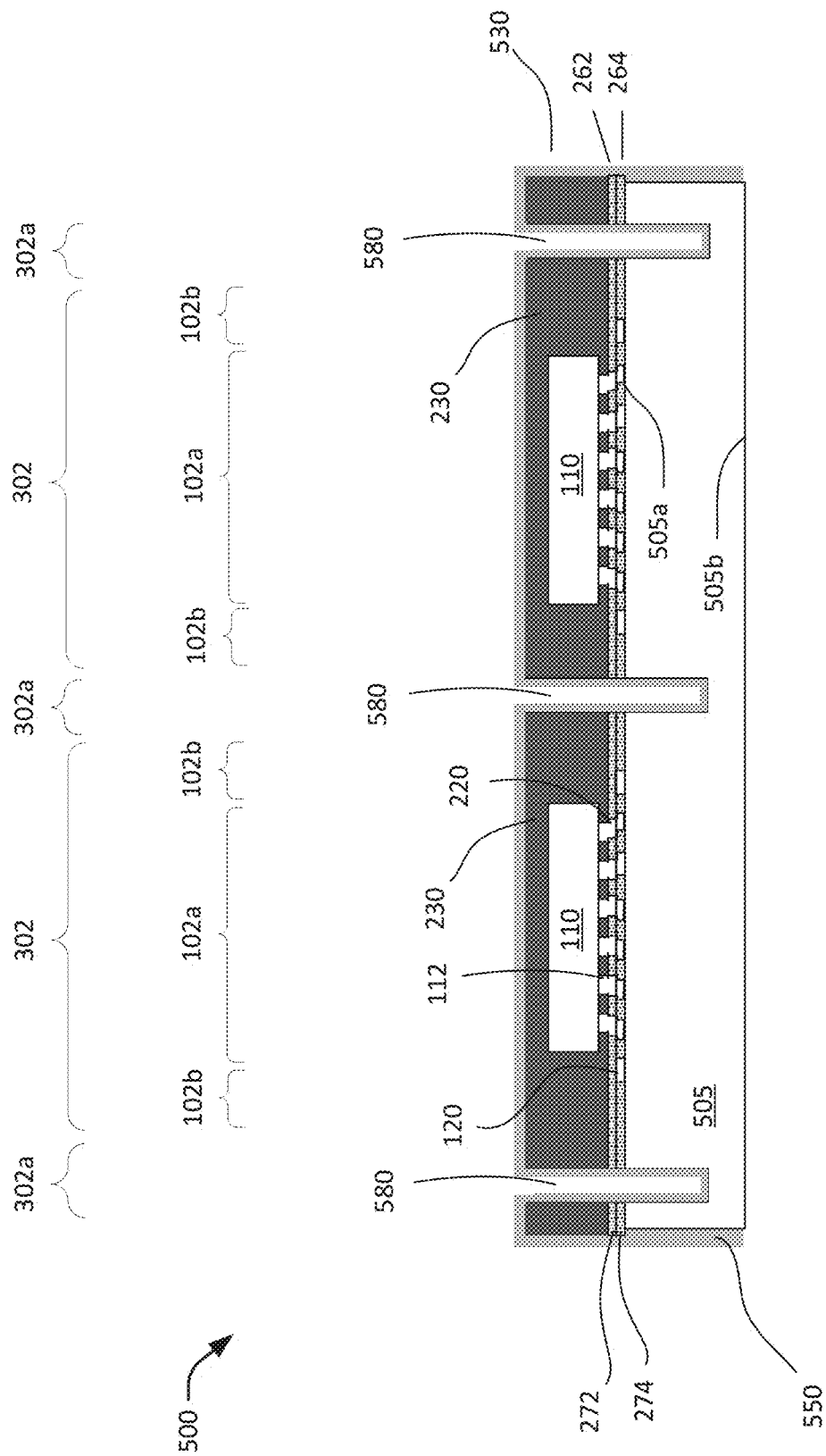

Referring to FIG. 5f, a shielding layer 550 is formed over the encapsulant 530 and lines the sidewalls and bottom of the cut clots 580. The shielding layer 550, for example, lines the top surface and sidewalls of the encapsulant 230 and extends to line the sides of the base carrier 505. In one embodiment, the shielding layer 550 does not extend to cover the bottom surface 505b of the base carrier 505. The bottom surface 505b of the base carrier 505 is, for example, exposed for further processing, as described in conjunction with FIGS. 5g-5h. The shielding layer 550 may be a conductive layer formed using any suitable deposition process such as, but not limited to, sputtering, evaporation, and plating. For example, a conductive material such as NiAuPd or Ag is sputter-deposited to form the shielding layer 550. Other techniques for forming the shielding layer may also be useful.

It is to be appreciated that in alternative cases where the encapsulant 530 is configured with a top surface that is substantially coplanar with the inactive surfaces of the semiconductor dies 110, the shielding layer 550 extends to cover the top surface of the encapsulant 530 and the inactive surfaces of the semiconductor dies 110 to form a semiconductor package same or similar to that shown in FIG. 2b. For example, the shielding layer 550 may correspond to an outer layer surrounding one or more packaged semiconductor die.

Figure 5G:
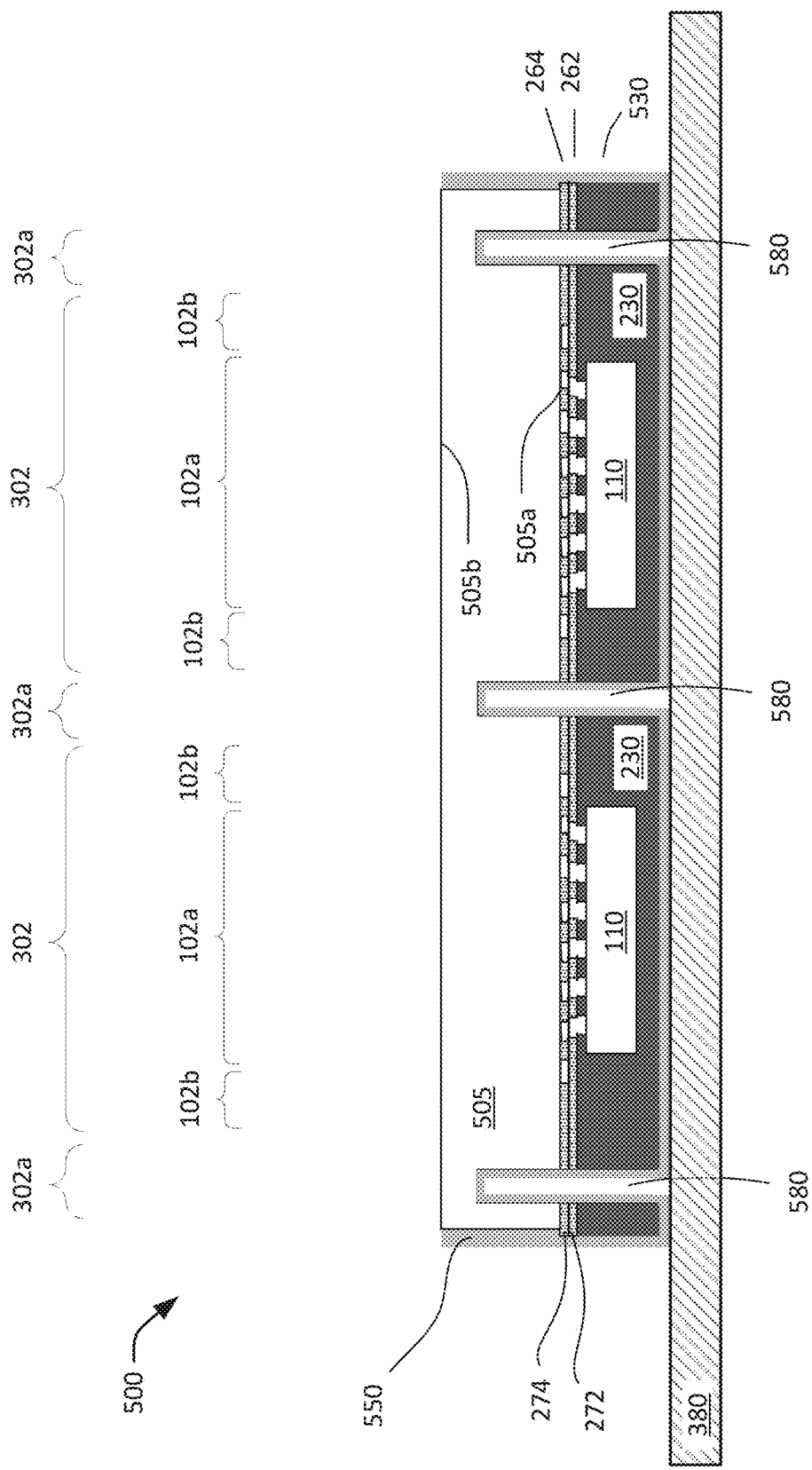

Referring to FIG. 5g, a temporary support carrier 380 having top and bottom surfaces is provided. The temporary support carrier 380, for example, provides support for processing the base carrier 505. In one embodiment, the portion of the shielding layer 550 which covers the top surface of the encapsulant 530 is mounted to the top surface of the support carrier 380. The bottom surface 505b of the base carrier 505 is, for example, exposed for further processing. An adhesive agent (not shown) may be provided on the top surface of the support carrier 380 to facilitate temporary bonding of the shielding layer 550 to the support carrier 380. Other temporary bonding techniques may also be useful. The adhesive agent may be provided on the top surface of the support carrier 380 using various techniques depending on the type or form of the adhesive agent.

Referring to FIG. 5h, a second singulation process is performed to physically separate the semiconductor packages formed in the active regions 302 of the base carrier 505. The second singulation process, in one embodiment, includes a wet etching technique to remove the base carrier 505 along with portions of the shielding layer 550 covering the base carrier. For example, a chemical etch process is employed to remove a base carrier 505 having copper material. Other suitable etching process may also be employed. The second singulation process removes the base carrier 505 to completely singulate the strip (or a panel) of semiconductor packages. For example, a plurality of individual semiconductor packages remains on the support 380.

In one embodiment, removing the base carrier 505 exposes an outer surface of the second type contact pads 120 for processing. For example, package contacts 170 are formed on the surface of the second type contact pads 120 exposed by the second passivation layer 274. The package contacts 170 may be spherical shaped bumps formed from solder material. Other shapes and materials of package contacts may also be useful. Various types of solder can be used to form the package contacts. For example, the solder can be a lead-based or non lead-based solder. The package contacts 170 may be formed by various techniques such as ball drop, screen printing and plating. Other techniques and materials may also be used to form the package contacts 160.

Figure 5I:
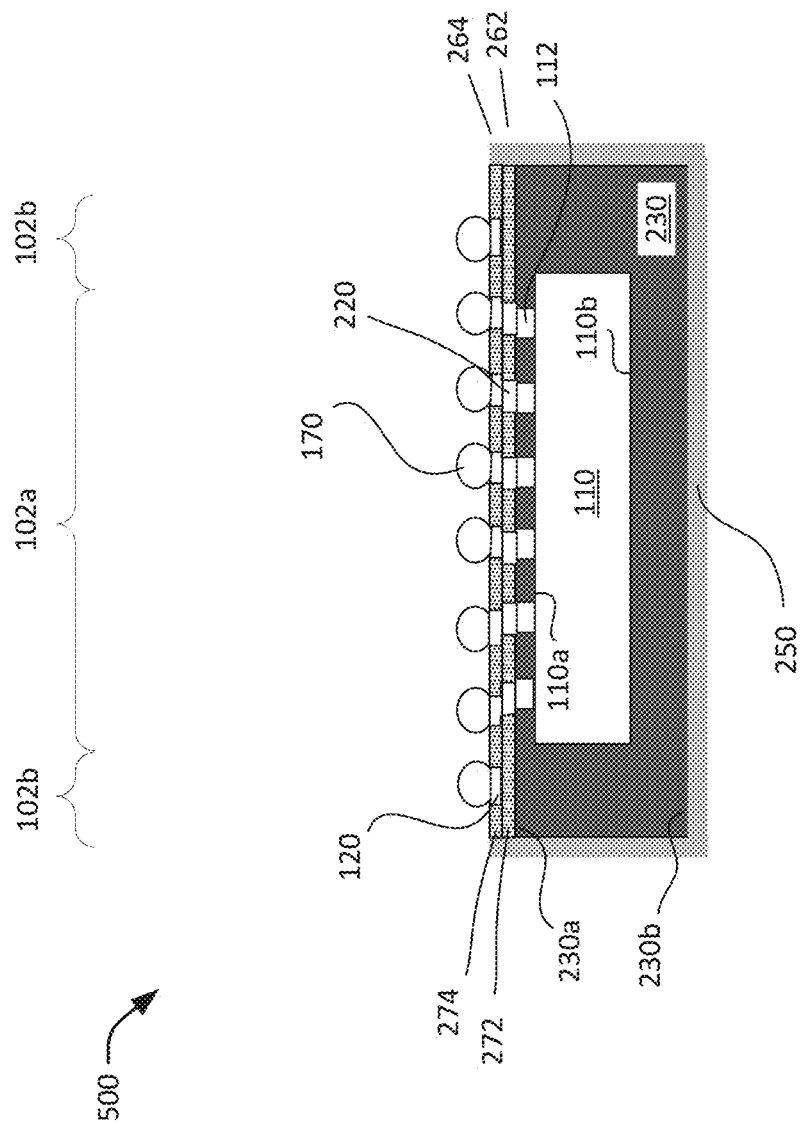

Referring to FIG. 5i, the individual semiconductor packages are detached from the support carrier after singulation. For example, the semiconductor package may be detached by physically pulling away (e.g., ripping) the semiconductor packages from the support carrier 380. Other techniques may also be useful. As shown in FIG. 5i, the process 500 may be employed to form semiconductor packages same or similar to that described in FIG. 2a.

Figure 6B:
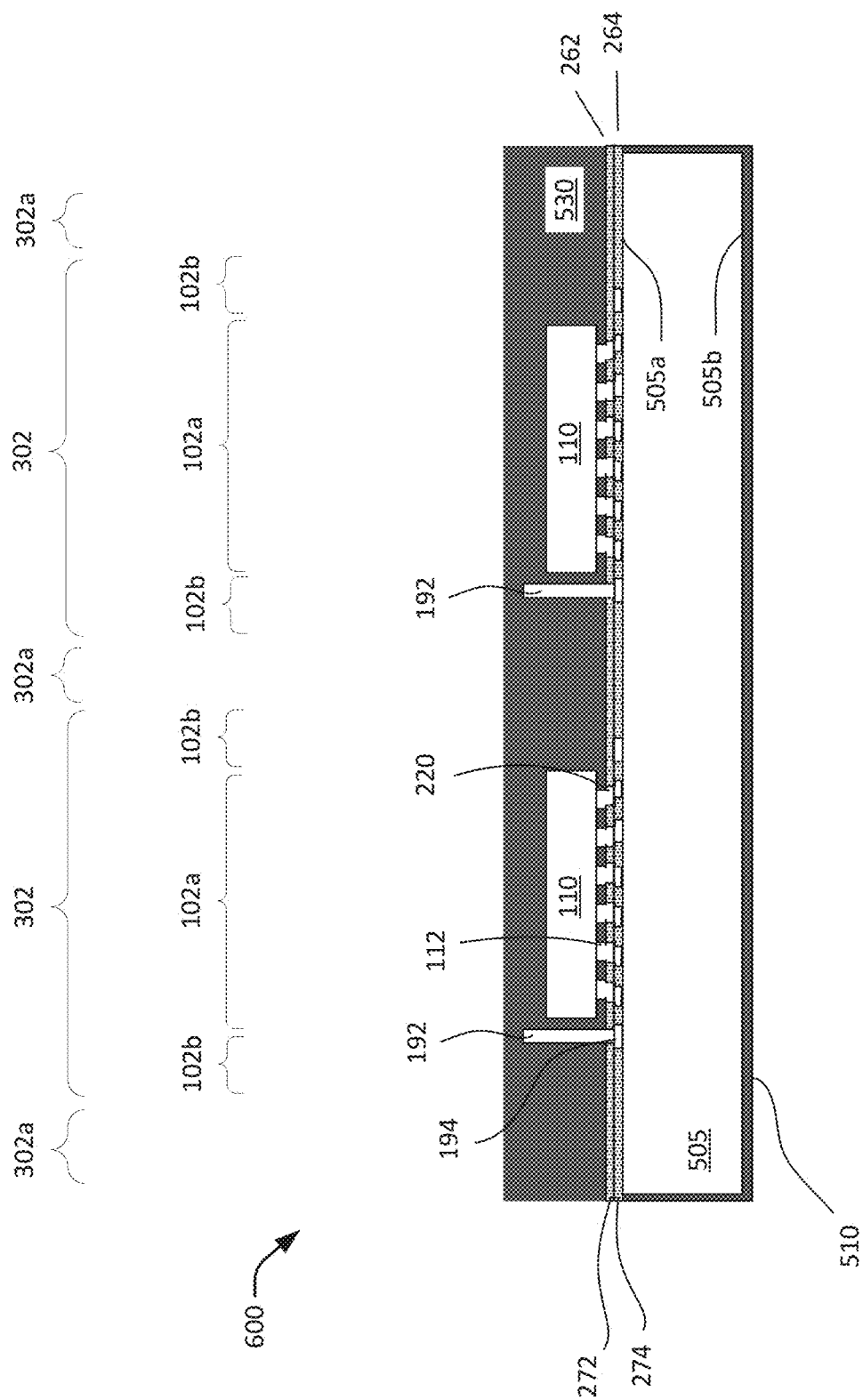

FIGS. 6a-6b show cross-sectional views of another embodiment of a process 600 for forming a semiconductor package. The semiconductor package is, for example, same or similar to that described in FIG. 1c. For example, the process 600 forms a semiconductor package having EMI protection. The process 600 may be similar to that described in FIGS. 4a-4b and 5a-5i. In the interest of brevity, common elements and features having the same reference numerals may not be described or described in detail.

Referring to FIG. 6a, a partially processed semiconductor package is provided. The partially processed semiconductor package is at the stage of processing as described in FIG. 5b. For example, interconnect structures (e.g., second type contact pads 120) of a first redistribution layer or level (RDL) 264 is formed on the base carrier 505 and a first passivation layer 274 is formed on the exposed top surface 505a of the base carrier 505 to insulate the interconnect structures of the first redistribution layer 264. In one embodiment, a second redistribution layer 262 is formed over the first redistribution layer 264. For example, the second redistribution layer includes conductive traces (not shown), via contacts (not shown) and first type contact pads 220.

In one embodiment, vertical interconnect structures corresponding to ground connectors 192 are formed on the first redistribution layer. For example, ground connectors 192 may be formed by bonding metal wires to ground pads 194 disposed in the non-die regions of the passivation layer 274 using wire bonding techniques. Other suitable techniques may also be employed to form the ground connector 192. The ground connectors 192 may extend from the ground pads 194 to a height higher than a subsequently provided semiconductor die 110. Materials used to form the ground connectors 192 include Au, Cu, Al, their alloys, and solder materials.

Referring to FIG. 6b, a second passivation layer 272 is formed to insulate the interconnect structures of the second redistribution layer 262. The passivation layer 262, for example, covers exposed top surfaces of the underlying passivation layer 274 and the second type contact pads 120. The passivation layer 262, for example, includes a sufficient thickness to surround the first type contact pads 220 without covering a top surface of the first type contact pads 220. A plurality of semiconductor dies 110 are mounted onto the first type contact pads 220 in the second passivation layer 272. For example, the first type contact pads 220 in the second passivation layer 272 are configured to match the pattern of the die contacts 112 of the semiconductor dies 110.

In one embodiment, a layer of encapsulant 530 is formed on the second passivation layer 272. For example, an encapsulation material is dispensed to encapsulate the semiconductor dies 110, die contacts 112 and ground connector 192. In one embodiment, the encapsulant 530 includes mold material, such as molding epoxy resin. Providing other types of encapsulation material may also be useful. The encapsulant 530 may be formed by a liquid encapsulation process such as transfer, compression or injection molding. Other techniques or materials may also be useful to form the encapsulant. In one embodiment, the encapsulant 530 extends over the inactive surfaces of the semiconductor dies and surrounds the ground connectors 192. The encapsulant 530, for example, includes a top surface extending over the ground connectors 192. A thinning process may be performed to reduce a thickness of the encapsulant and expose the top surface of the ground connectors 192. For example, a grinding process or CMP may be employed to provide an encapsulant 530 having a planar top surface that is coplanar to the top-most surface of the ground connectors 192, similar to that shown in FIG. 1c.

The process continues, as similarly described in FIGS. 5e-5i, to remove the base carrier 505 and form package contacts 170 on the exposed portions of the second type contact pads 120. As such, these process steps will not be described or described in detail. The process continues until a semiconductor package same or similar to that shown in FIG. 1c is formed.

Figure 7A:
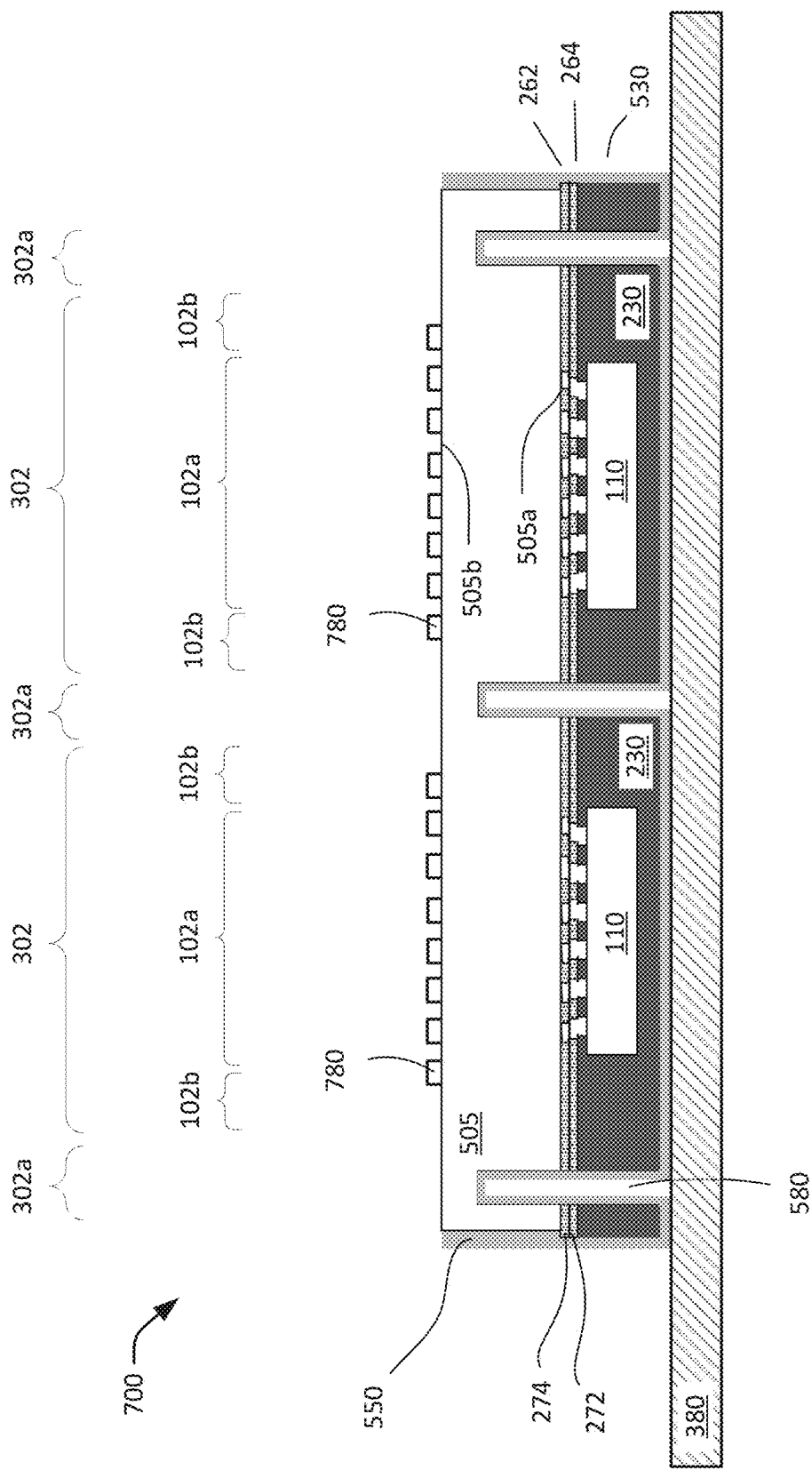
FIGS. 7a-7c show cross-sectional views of another embodiment of a process for forming a semiconductor package.
Figure 7B:
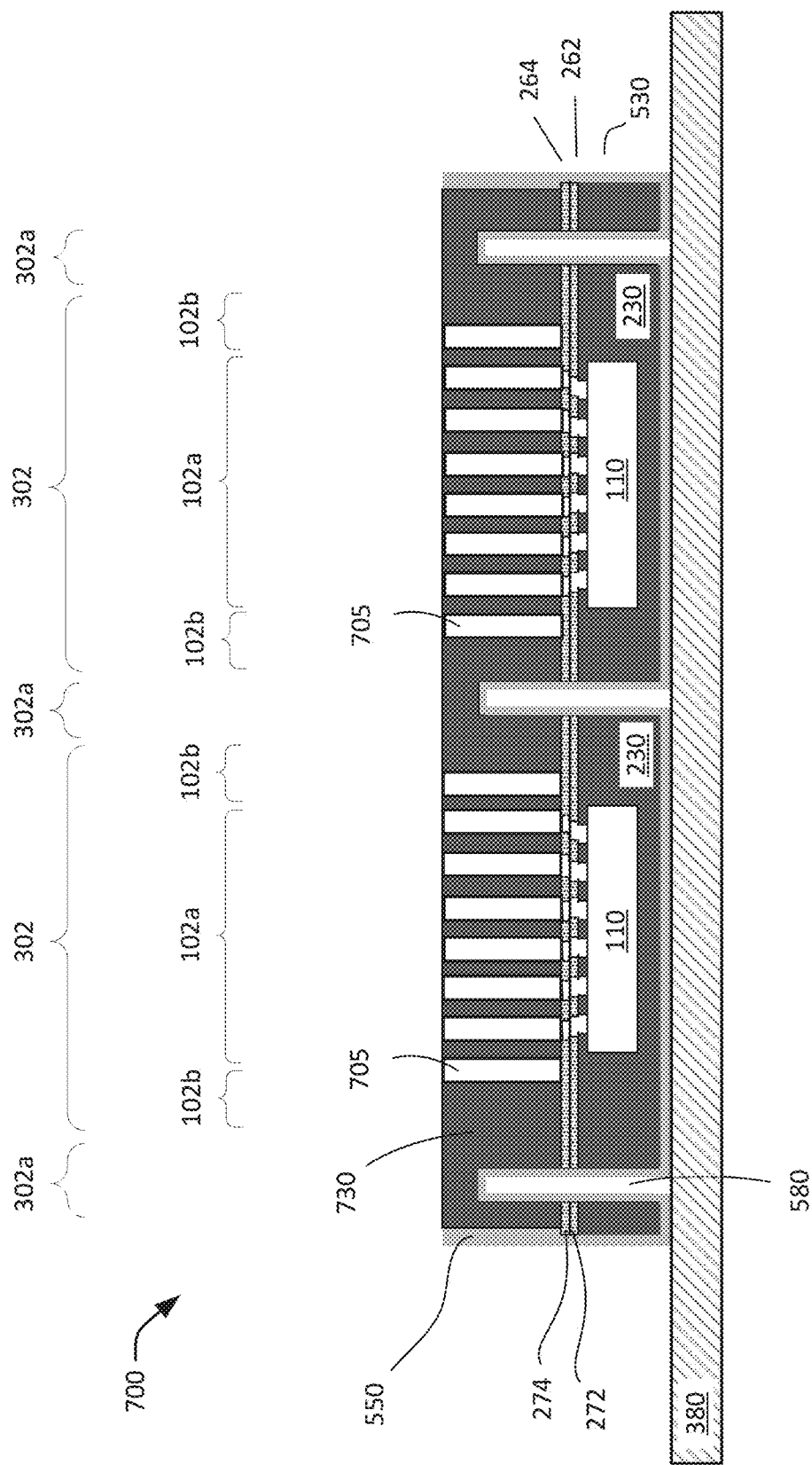
Figure 7C:
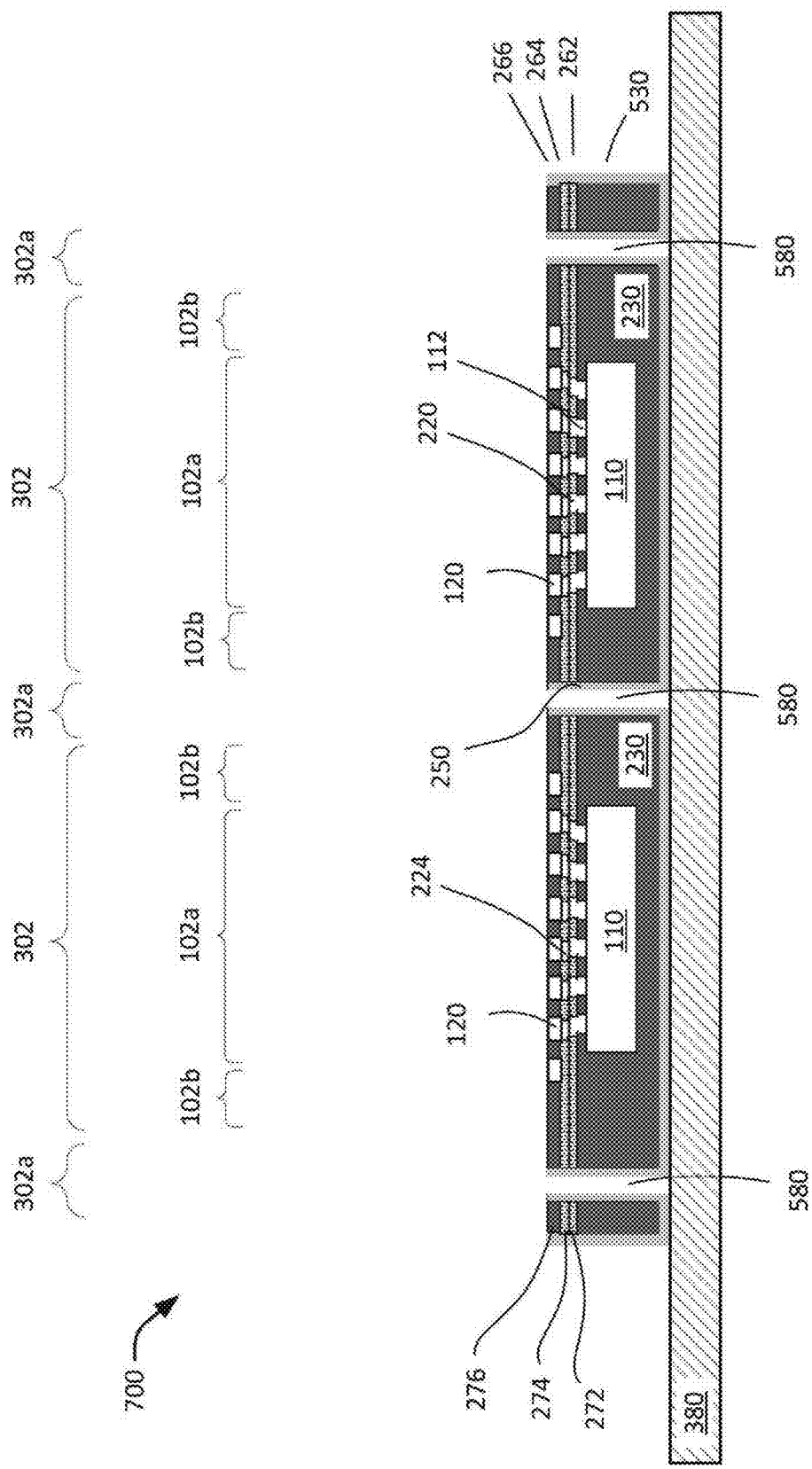

FIGS. 7a-7c show cross-sectional views of another embodiment of a process 700 for forming a semiconductor package. The semiconductor package is, for example, same or similar to that described in FIG. 2c. For example, the process 700 forms a semiconductor package having EMI protection. The process 700 may be similar to that described in FIGS. 5a-5i. In the interest of brevity, common elements and features having the same reference numerals may not be described or described in detail.

Referring to FIG. 7a, a partially processed semiconductor package is provided. The partially processed semiconductor package is at the stage of processing described in FIG. 5g. For example, a temporary support carrier 380 having top and bottom surfaces provides support for processing an exposed bottom surface 505b of the base carrier 505. The portion of the shielding layer 550 which covers the top surface of the encapsulant 530 is mounted to the top surface of the support carrier 380.

In one embodiment, a patterned mask layer 780, such as a photoresist, is provided on the bottom surface 505b of the base carrier 505. For example, the patterned mask layer 780 selectively exposes portions of the base carrier 505 to be removed and protects portions of the base carrier 505 which correspond to locations where second type contact pads are to be formed.

Referring to FIG. 7b, an etch process is performed to pattern a base carrier 505 having copper material. The patterned mask layer 780, for example, functions as an etch mask layer. Other techniques may also be employed to pattern the base carrier. For example, stealth dicing, mechanical sawing, or laser cutting techniques may also be employed. In the case where an etchant is not used to pattern the base carrier, the etch mask layer described in FIG. 7a may not be formed. The etching process, in one embodiment, may be a wet etch process. For example, a chemical etch process removes exposed portions of the base carrier 505 and patterns the base carrier 550 to form conductive strips 705. The conductive strips 705 are electrically connected to the first and second redistribution layers 264 and 262. The conductive strips may be copper strips 705. Patterning the base carrier 505 concurrently forms a cavity surrounding the conductive strips 705 and cut slots 580.

In one embodiment, an encapsulation material 730 is deposited to fill the cavity formed from patterning the base carrier 505. The encapsulation material 730 is, for example, a molding material same as the molding material of the encapsulant 530. The encapsulation material 730 may be deposited by chemical vapor deposition (CVD), or physical vapor deposition (PVD) techniques, to a height substantially same as a height of the conductive strips 705. Other configurations of the encapsulation material 730 and conductive strips may also be useful.

Referring to FIG. 7c, a thinning process is performed to define a final thickness of the encapsulation material 730 and conductive strips 705. The thinning process may be any suitable thinning process. For example, a grinding process or CMP is performed on the exposed top surface of the encapsulation material 730 and conductive strips 705 to form the a third (or topmost) passivation layer 276 and second type contact pads 120 respectively, as described with respect to FIG. 2c. The thinning process, for example, forms second type contact pads 120 having a thickness of about 10 μm. Other thickness dimensions may also be useful.

The process continues, as similarly described in FIGS. 5h-5i, to form package contacts 170 on the top surface of the second type contact pads 120 exposed from the third passivation layer 276. As such, these process steps will not be described or described in detail. The process continues until a semiconductor package same or similar to that shown in FIG. 2c is formed.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A method for forming a semiconductor package, comprising:
    providing a base carrier defined with an active region and a non-active region, the base carrier has first and second major surfaces;
    forming a fan-out redistribution structure over the first major surface of the base carrier;
    mounting a die having first and second major surfaces onto the base carrier over the fan-out redistribution structure after formation of the fan-out redistribution structure, the first major surface of the die is an active surface of the die and the second major surface of the die is an inactive surface of the die, wherein the die comprises elongated die contacts protruding from the active surface of the die, the die contacts corresponding to conductive pillars, wherein the die contacts are in electrical communication with the fan-out redistribution structure;
    forming an encapsulant having a first major surface and a second major surface opposite to the first major surface, wherein the first major surface is proximate to the inactive surface of the die, wherein the encapsulant surrounds the die contacts and sidewalls of the die; and
    forming an electromagnetic interference (EMI) shielding layer, wherein the EMI shielding layer lines the first major surface and sides of the encapsulant.

2. The method in claim 1 comprises a first singulation forming a cut slot extending from the first major surface of the encapsulant and partially into the base carrier in the inactive region.

3. The method in claim 2 wherein the EMI shielding layer lines sidewalls of the cut slot.

4. The method in claim 2 comprises a second singulation after the first singulation removing the base carrier.

5. The method in claim 4 wherein the second singulation comprises an etch process to completely remove the base carrier and singulate the semiconductor package.

6. The method in claim 3 wherein the base carrier comprise a conductive material.

7. The method in claim 6 comprises patterning the base carrier to form conductive strips electrically connected to the fan-out redistribution structure and a cavity surrounding the conductive strips and the cut slot.

8. The method in claim 7 comprises:
    filling the cavity with an passivation encapsulant material; and
    thinning the passivation encapsulant material and the conductive strips to form a passivation layer and contact pads surrounded by the passivation layer over the fan-out redistribution structure.

9. The method in claim 1 wherein the EMI shielding layer comprises a metal layer.

10. The method of claim 1 wherein the EMI shielding layer comprises a nickel-goldpalladium (NiAuPd) alloy.

11. The method of claim 1 wherein the EMI shielding layer comprises a silver (Ag) layer.

12. A method for forming a semiconductor package, comprising:
    providing a base carrier defined with an active region and a non-active region, the base carrier has first and second major surfaces;
    forming a fan-out redistribution structure over the first major surface of the base carrier;
    mounting a die having first and second major surfaces onto the base carrier over the fan-out redistribution structure after formation of the fan-out redistribution structure, the first major surface of the die is an active surface of the die and the second major surface of the die is an inactive surface of the die, wherein the die comprises elongated die contacts protruding from the active surface of the die, the die contacts corresponding to conductive pillars, wherein the die contacts are in electrical communication with the fan-out redistribution structure;
    forming an encapsulant having a first major surface and a second major surface opposite to the first major surface, wherein the first major surface is proximate to the inactive surface of the die, wherein the encapsulant surrounds the die contacts and sidewalls of the die;

forming an electromagnetic interference (EMI) shielding layer, wherein the EMI shielding layer lines the first major surface and sides of the encapsulant; and performing an etch process after forming the EMI shielding layer, wherein the etch process completely removes the base carrier and singulates the semiconductor package.

13. The method in claim 12 comprises a first singulation process forming a cut slot extending from the first major surface of the encapsulant and partially into the base carrier in the inactive region.

14. The method in claim 13 wherein the EMI shielding layer lines sidewalls of the cut slot.

15. The method in claim 13 wherein the etch process is performed as a second singulation after the first singulation to remove the base carrier.

16. The method in claim 14 wherein the base carrier comprise a conductive material.

17. The method in claim 16 comprises patterning the base carrier to form conductive strips electrically connected to the fan-out redistribution structure and a cavity surrounding the conductive strips and the cut slot.

18. The method in claim 17 comprises:
filling the cavity with a passivation encapsulant material; and
thinning the passivation encapsulant material and the conductive strips to form a passivation layer and contact pads surrounded by the passivation layer over the fan-out redistribution structure.

19. The method in claim 18 wherein the passivation encapsulant material comprises a same molding material as the encapsulant.

20. The method in claim 18 comprises forming package contacts disposed on the contact pads of the fan-out redistribution structure.

\* \* \* \* \*